United States Patent
Fong et al.

(10) Patent No.: US 9,588,294 B2
(45) Date of Patent: Mar. 7, 2017

(54) CONTROLLING THE COMPOSITION OF ELECTRO-ABSORPTION MEDIA IN OPTICAL DEVICES

(71) Applicant: Kotura, Inc., Monterey Park, CA (US)

(72) Inventors: Joan Fong, San Marino, CA (US); Wei Qian, Torrance, CA (US); Dazeng Feng, El Monte, CA (US); Mehdi Asghari, Pasadena, CA (US)

(73) Assignee: Mellanox Technologies Silicon Photonics Inc., Monterey Park, CA (US)

( * ) Notice: Subject to any disclaimer, the term of this patent is extended or adjusted under 35 U.S.C. 154(b) by 106 days.

(21) Appl. No.: 14/322,672

(22) Filed: Jul. 2, 2014

(65) Prior Publication Data
US 2015/0010263 A1  Jan. 8, 2015

Related U.S. Application Data

(60) Provisional application No. 61/842,341, filed on Jul. 2, 2013.

(51) Int. Cl.
| | |
|---|---|
| G02B 6/12 | (2006.01) |
| G02B 6/13 | (2006.01) |
| G02F 1/025 | (2006.01) |
| H01L 31/18 | (2006.01) |
| G02F 1/17 | (2006.01) |
| G02F 1/015 | (2006.01) |

(52) U.S. Cl.
CPC ............... *G02B 6/13* (2013.01); *G02F 1/025* (2013.01); *G02F 1/174* (2013.01); *H01L 31/1812* (2013.01); *G02F 2001/0155* (2013.01); *G02F 2001/0157* (2013.01)

(58) Field of Classification Search
None
See application file for complete search history.

(56) References Cited

U.S. PATENT DOCUMENTS

| | | | | |
|---|---|---|---|---|
| 7,603,016 | B1 * | 10/2009 | Soref | B82Y 20/00 385/129 |
| 2003/0138178 | A1 * | 7/2003 | Kimerling et al. | G02F 1/015 385/2 |
| 2007/0116398 | A1 * | 5/2007 | Pan et al. | G02F 1/025 385/2 |
| 2010/0330727 | A1 * | 12/2010 | Hill et al. | G02F 1/025 438/69 |

(Continued)

FOREIGN PATENT DOCUMENTS

JP   2002-289971 A  * 10/2002

*Primary Examiner* — Mike Stahl
(74) *Attorney, Agent, or Firm* — Gavrilovich, Dodd & Lindsey, LLP

(57) ABSTRACT

Forming an optical device includes growing an electro-absorption medium in a variety of different regions on a base of a device precursor. The regions include a component region and the regions are selected so as to achieve a particular chemical composition for the electro-absorption medium included in the component region. An optical component is formed on the device precursor such that the optical component includes at least a portion of the electro-absorption medium from the component region. Light signals are guided through the electro-absorption medium from the component region during operation of the component.

20 Claims, 15 Drawing Sheets

(56) References Cited

U.S. PATENT DOCUMENTS

2011/0142390 A1\* 6/2011 Feng et al. .............. G02F 1/025
  385/2
2015/0244466 A1\* 8/2015 Okamoto et al. ...... H04B 10/50
  398/140

\* cited by examiner

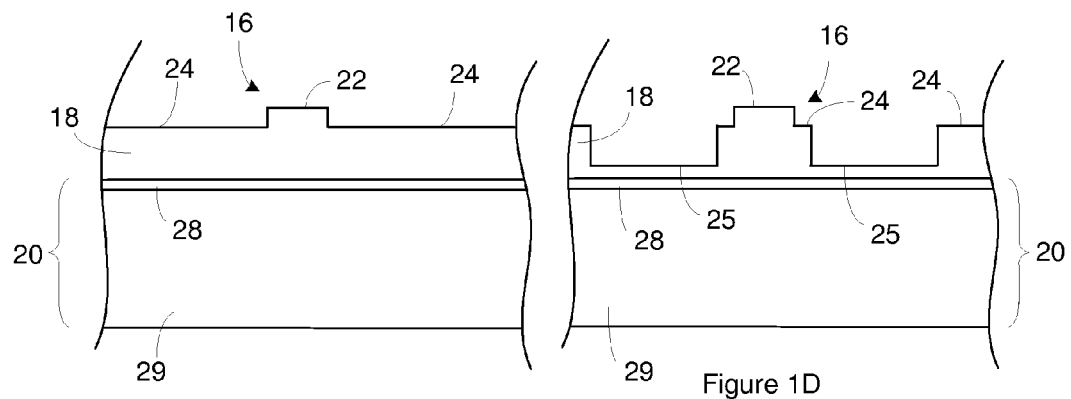
Figure 1C
Figure 1D
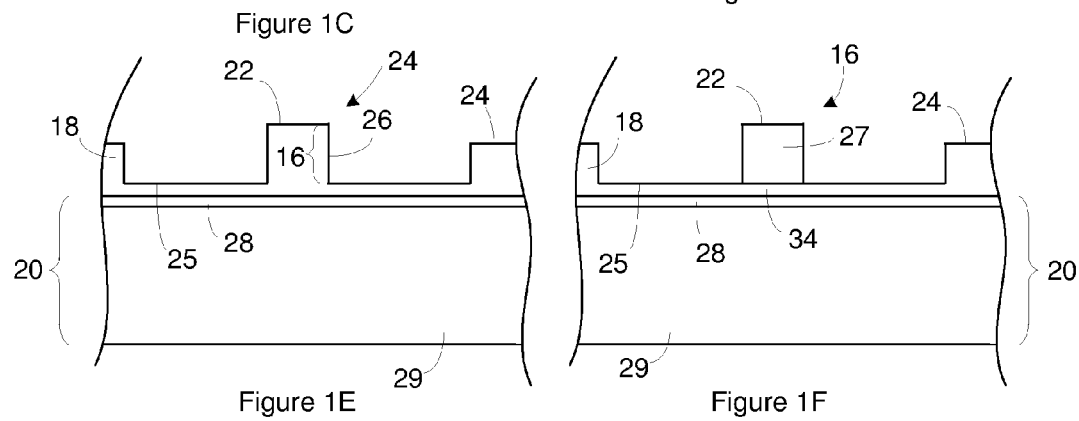
Figure 1E
Figure 1F
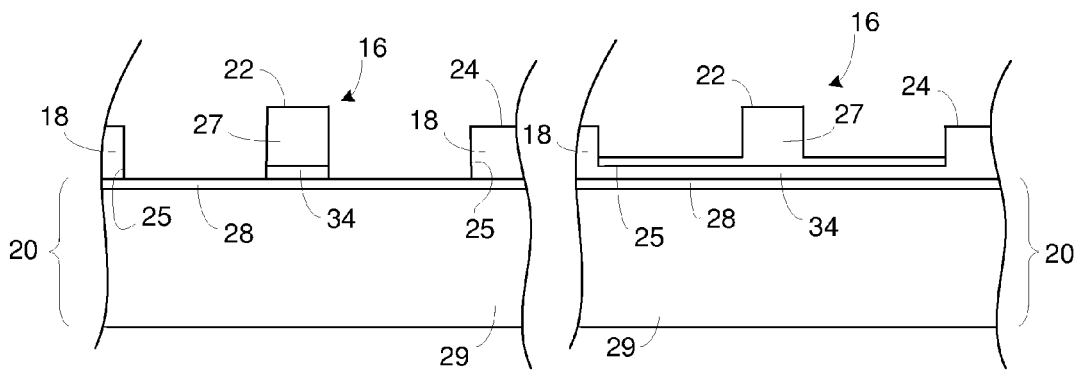
Figure 1G
Figure 1H

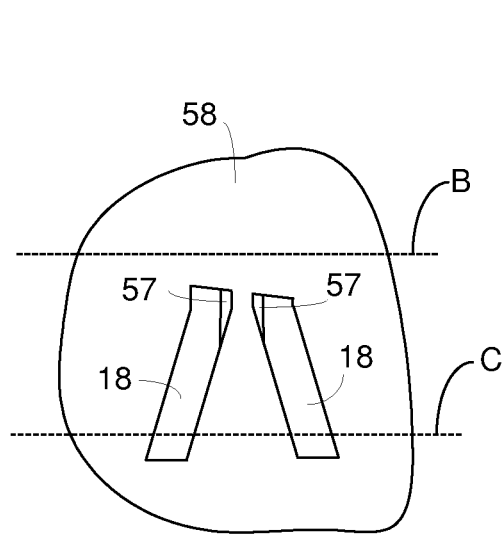
Figure 9A
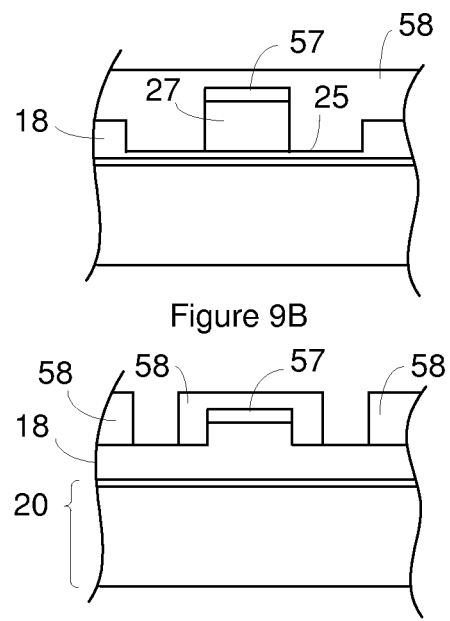
Figure 9B
Figure 9C
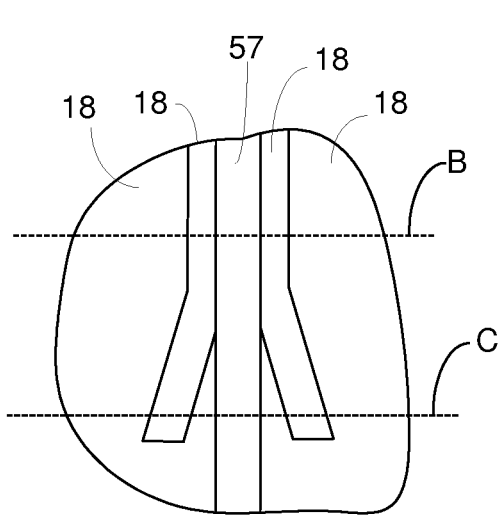
Figure 10A
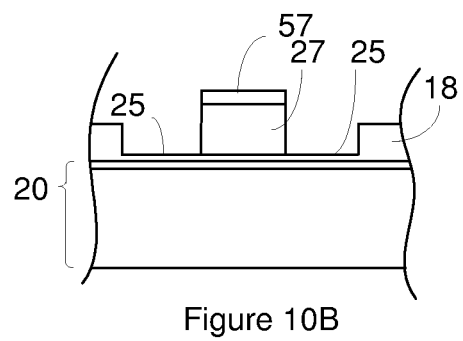
Figure 10B
Figure 10C

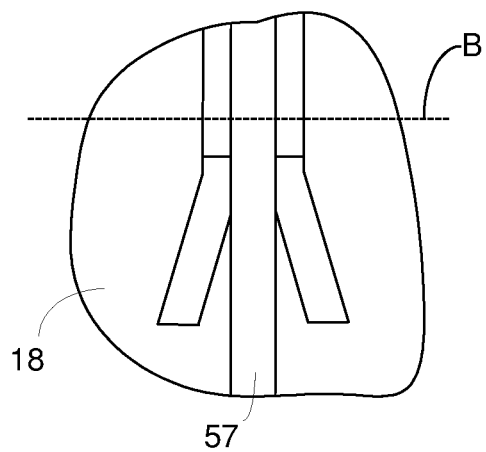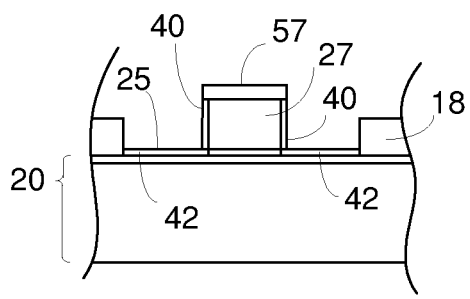
Figure 11A
Figure 11B
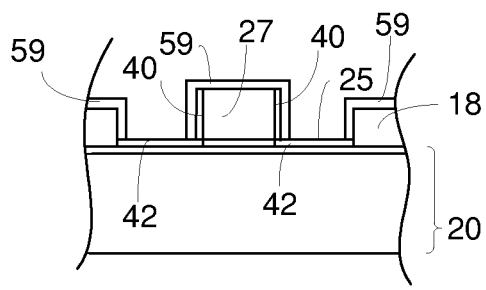
Figure 12
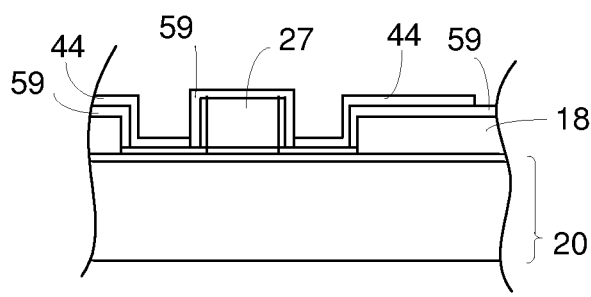
Figure 13
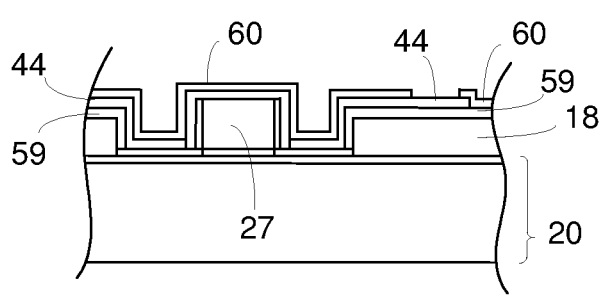
Figure 14

CONTROLLING THE COMPOSITION OF ELECTRO-ABSORPTION MEDIA IN OPTICAL DEVICES

RELATED APPLICATIONS

This patent application claims the benefit of U.S. Provisional Patent Application Ser. No. 61/842,341, filed on Jul. 2, 2013, entitled "Controlling the Composition of Electro-Absorption Media in Optical Devices," and incorporated herein in its entirety.

FIELD

The present invention relates to optical devices and more particularly to devices that use electro-absorption media.

BACKGROUND

The use of optical and/or optoelectronic devices is increasing in communications applications. These devices can include a variety of components that make use of electro-absorption media such as silicon-germanium (SiGe). These components include components such as modulator and light sensors. The composition of the electro-absorption medium used in these components typically affects the performance of the component. For instance, the ratio of Si:Ge in SiGe can affect the modulation wavelength of a modulator. However, the composition of these electro-absorption media is often difficult to control. The composition is even more difficult to control when different components on a single device each use an electro-absorption medium with a different composition. As a result, there is a need to control the composition of the electro-absorption media included on optical devices.

SUMMARY

An optical device includes an optical component on a base. The optical component includes an electro-absorption medium through which light signals are guided during operation of the component. The device also includes dummy regions on the base. The dummy regions includes the electro-absorption medium but the electro-absorption medium included in the dummy regions is not included in the component or in another optical component on the base.

Forming an optical device includes growing an electro-absorption medium in a variety of different regions on a base of a device precursor. The regions include a component region and dummy regions. The dummy regions are selected so as to achieve a particular chemical composition for the electro-absorption medium included in the component region. An optical component is formed on the device precursor such that the optical component includes at least a portion of the electro-absorption medium from the component region. Light signals are guided through the electro-absorption medium from the component region during operation of the component.

BRIEF DESCRIPTION OF THE FIGURES

FIG. 1A through FIG. 1I illustrate an optical device having an optical modulator configured. The modulator includes field sources that are configured to generate a substantially horizontal electrical field in an electro-absorption medium. The device illustrated in FIG. 1A through FIG. 1I employs doped regions of the electro-absorption medium as the field sources. FIG. 1A is a perspective view of the device.

FIG. 1B is a topview of the portion of the optical device shown in FIG. 1A that includes the optical modulator.

FIG. 1C is a cross-section of the device shown in FIG. 1A taken along the line labeled C.

FIG. 1D is a cross-section of the optical device shown in FIG. 1A taken along the line labeled D.

FIG. 1E is a cross-section of the optical device shown in FIG. 1A taken along the line labeled E.

FIG. 1F is a cross-section of the optical device shown in FIG. 1A taken along the line labeled F.

FIG. 1G is a cross-section of the optical device shown in FIG. 1A taken along the line labeled F.

FIG. 1H is a cross-section of the optical device shown in FIG. 1A taken along the line labeled F. The embodiments shown in FIG. 1F, FIG. 1G, and FIG. 1H are alternative embodiments.

FIG. 1I is a cross-section of the optical device shown in FIG. 1A taken along the line labeled I. The cross section is through a modulator constructed on a waveguide having a structure according to FIG. 1F.

FIG. 4A is a topview of a device such as the device shown in FIG. 1B but with more of the device shown.

FIG. 4B is a cross section of the device shown in FIG. 4A taken along the line labeled B.

FIG. 4C is a topview of the device.

FIG. 4D is a cross section of the device shown in FIG. 4C taken along the line labeled D in FIG. 4C.

FIG. 4E is a topview of the device.

FIG. 4F is a cross section of the device shown in FIG. 4E taken along the line labeled F in FIG. 4E.

FIG. 5A through FIG. 14 illustrate a method of forming an optical device having a modulator constructed according to FIG. 1A through FIG. 1F, and FIG. 1I.

DESCRIPTION

Figure 1A:
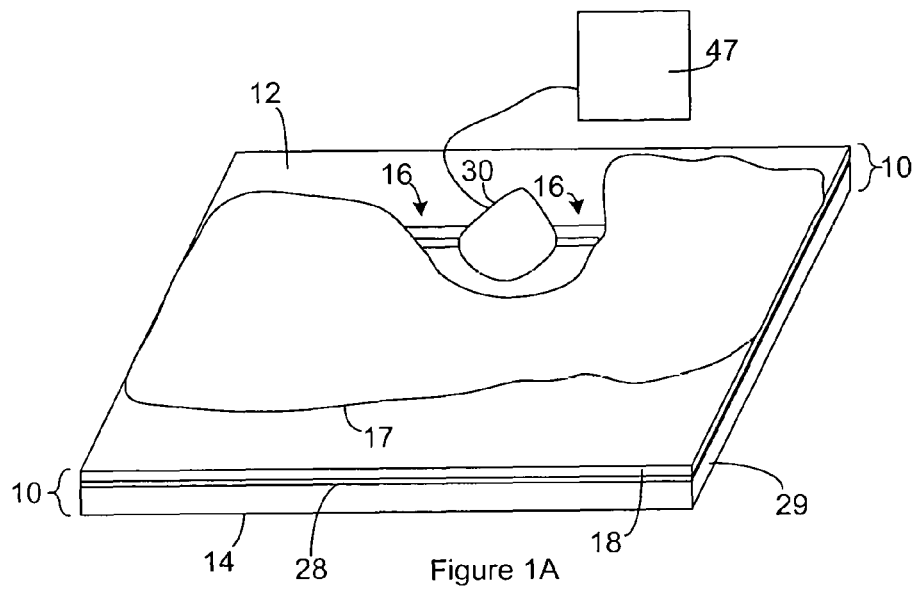

Forming an optical device includes growing an electro-absorption medium in a variety of different regions on a base of a device precursor. A portion of the regions are dummy regions and another portion of the regions are component regions. An optical component such as a modulator is formed on the device so the optical component includes at least a portion of the electro-absorption medium from the component regions. In contrast, the electro-absorption medium from the dummy regions is not included in any optical components. For instance, electrical energy does not flow through the dummy regions and/or electrical energy is not applied to the dummy regions during operation of the optical components on the device. The inventors have surprisingly found that the characteristics of the dummy regions affects the composition of the electro-absorption medium in the component region. Without being bound to theory, this is believed to be a result of microloading during growth of the electro-absorption medium by methods such as epitaxial growth.

Since the characteristics of the dummy regions affects the composition of the electro-absorption medium in the component region, the features of these dummy regions can be tuned so as to achieve a particular composition for the electro-absorption medium in the component region. This composition can have a strong effect on the performance of many optical components. For instance, in Franz-Keldysh modulators that employ $Ge_{1-x}Si_x$ (germanium-silicon) as the electro-absorption medium, the modulation wavelength can be shifted by around 200 nm simply by changing the percentage of silicon in the $Ge_{1-x}Si_x$ by around 4%. As a result, the ability to control the composition of the electro-absorption medium in the component region allows the modulation wavelength of these components to be controlled.

Further, the effect of the dummy regions on the composition of the electro-absorption medium in the component region can be localized on the device. As a result, the composition of the electro-absorption medium can be controlled at several different locations on the device. For instance, different dummy regions can be local to different component regions and the dummy regions that are local to different component regions can have different characteristics. As a result, the composition of the electro-absorption medium in different component regions can be controlled and different even though the electro-absorption medium in the different component regions was formed at the same time.

Since the electro-absorption medium in different component regions can be controlled and different, the same type of components can be formed on the device but with different performance characteristics. For instance, the electro-absorption medium for multiple modulators can be concurrently formed on the device and different modulators can be formed with different modulation wavelengths. Experimental results have shown that the difference in the modulation wavelength for modulators having concurrently formed electro-absorption media can be greater than 50 nm, 100 nm, 200 nm, or even 300 nm. As a result, the use of dummy regions can eliminate the need to serially form these components on the device providing a more efficient fabrication process.

Figure 1B:
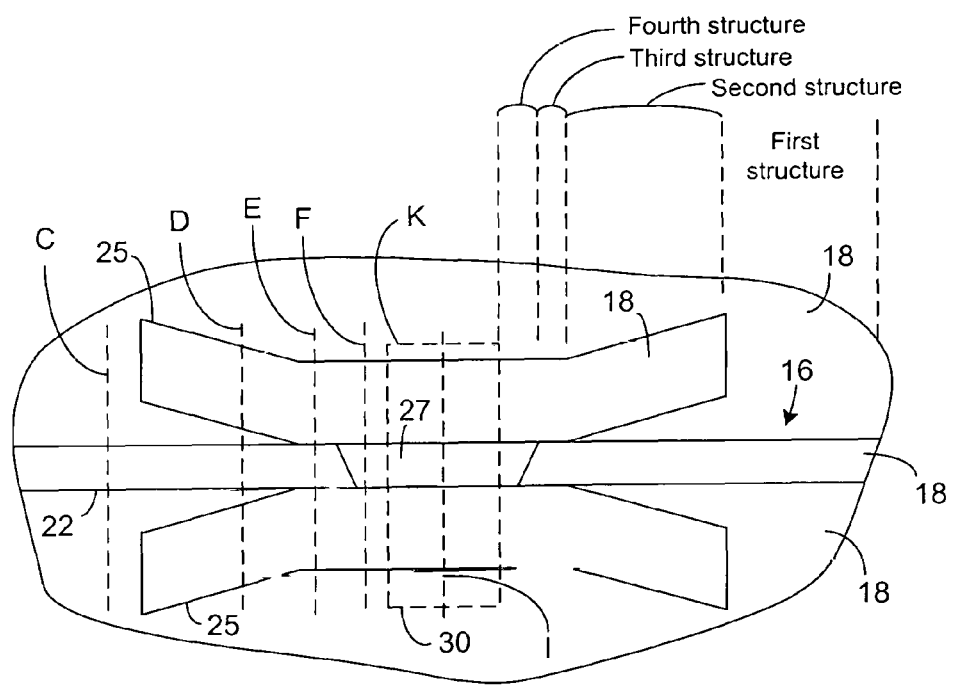
Figure 1I:
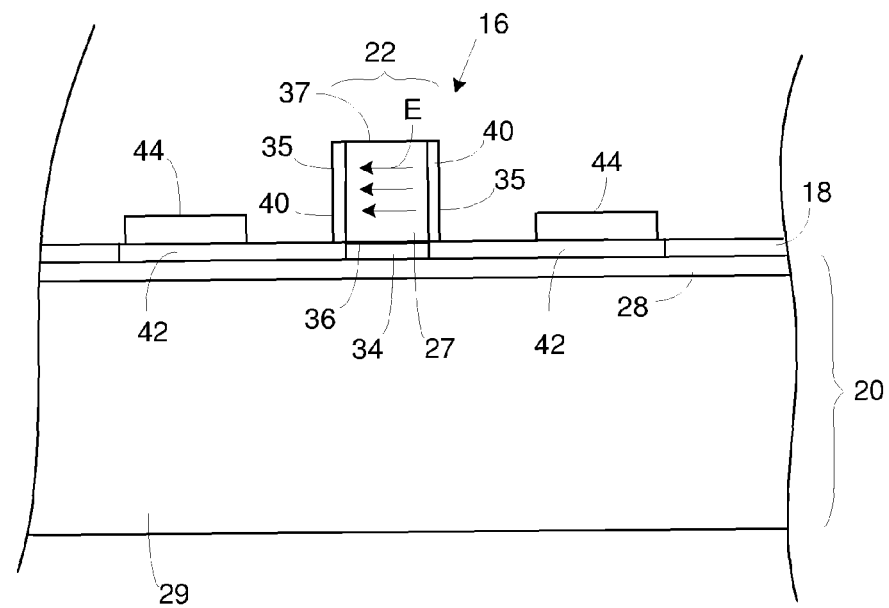

FIG. 1A through FIG. 1I illustrate an optical device having a waveguide that includes a modulator. FIG. 1A is a perspective view of the device. FIG. 1B is a topview of the portion of the optical device shown in FIG. 1A that includes an optical modulator. FIG. 1C is a cross-section of the device shown in FIG. 1A taken along the line labeled C. FIG. 1D is a cross-section of the optical device shown in FIG. 1A taken along the line labeled D. FIG. 1E is a cross-section of the optical device shown in FIG. 1A taken along the line labeled E. FIG. 1F is a cross-section of the optical device shown in FIG. 1A taken along the line labeled F. FIG. 1G is a cross-section of the optical device shown in FIG. 1A taken along the line labeled F. FIG. 1H is a cross-section of the optical device shown in FIG. 1A taken along the line labeled F. The embodiments shown in FIG. 1F, FIG. 1G, and FIG. 1H are alternative embodiments. FIG. 1I is a cross-section of the optical device shown in FIG. 1A taken along the line labeled I.

The device is within the class of optical devices known as planar optical devices. These devices typically include one or more waveguides immobilized relative to a substrate or a base. The direction of propagation of light signals along the waveguides is generally parallel to a plane of the device. Examples of the plane of the device include the top side of the base, the bottom side of the base, the top side of the substrate, and/or the bottom side of the substrate.

The illustrated device includes lateral sides 10 (or edges) extending from a top side 12 to a bottom side 14. The propagation direction of light signals along the length of the waveguides on a planar optical device generally extends through the lateral sides 10 of the device. The top side 12 and the bottom side 14 of the device are non-lateral sides.

The device includes one or more waveguides 16 that carry light signals to and/or from optical components 17. Examples of optical components 17 that can be included on the device include, but are not limited to, one or more components selected from a group consisting of facets through which light signals can enter and/or exit a waveguide, entry/exit ports through which light signals can enter and/or exit a waveguide from above or below the device, multiplexers for combining multiple light signals onto a single waveguide, demultiplexers for separating multiple light signals such that different light signals are received on different waveguides, optical couplers, optical switches, lasers that act as a source of a light signal, amplifiers for amplifying the intensity of a light signal, attenuators for attenuating the intensity of a light signal, modulators for modulating a signal onto a light signal, modulators that convert an light signal to an electrical signal, and vias that provide an optical pathway for a light signal traveling through the device from the bottom side 14 of the device to the top side 12 of the device. Additionally, the device can optionally, include electrical components. For instance, the device can include electrical connections for applying a potential or current to a waveguide and/or for controlling other components on the optical device.

A portion of the waveguide includes a first structure where a portion of the waveguide 16 is defined in a light-transmitting medium 18 positioned on a base 20. For instance, a portion of the waveguide 16 is partially defined by a ridge 22 extending upward from a slab region of the light-transmitting medium as shown in FIG. 1C. In some instances, the top of the slab region is defined by the bottom of trenches 24 extending partially into the light-transmitting medium 18 or through the light-transmitting medium 18. Suitable light-transmitting media include, but are not limited to, silicon, polymers, silica, SiN, GaAs, InP and $LiNbO_3$.

One or more cladding layers (not shown) are optionally positioned on the light-transmitting medium. The one or more cladding layers can serve as a cladding for the waveguide 16 and/or for the device. When the light-transmitting medium 18 is silicon, suitable cladding layers include, but are not limited to, polymers, silica, SiN, GaAs, InP and LiNbO$_3$.

Recesses 25 (FIG. 1B) extend into the slab regions such that the ridge 22 is positioned between recesses 25. The recesses 25 can extend only part way into the light-transmitting medium 18. As is evident from FIG. 1D, the recesses 25 can be spaced apart from the ridge 22. As a result, a portion of the waveguide 16 includes a second structure where an upper portion of the waveguide 16 is partially defined by the ridge 22 extending upward from the slab region and a lower portion of the waveguide is partially defined by recesses 25 extending into the slab regions and spaced apart from the ridge.

As shown in FIG. 1E, the recesses 25 can approach the ridge 22 such that the sides of the ridge 22 and the sides of the recesses 25 combine into a single surface 26. As a result, a portion of a waveguide includes a third structure where the waveguide is partially defined by the surface 26.

As is evident in FIG. 1B, a portion of the waveguide includes an electro-absorption medium 27. The electro-absorption medium 27 is configured to receive the light signals from a portion of the waveguide having the third structure and to guide the received light signals to another portion of the waveguide having the third structure.

The electro-absorption medium 27 extends upward from the bottom of the recesses 25. The electro-absorption medium 27 is configured to guide the light signals. For instance, as is evident in FIG. 1F, a portion of a waveguide includes a fourth structure where the waveguide is partially defined by the top and lateral sides of the electro-absorption medium 27.

In FIG. 1F, the electro-absorption medium 27 is positioned on a seed portion 34 of the light-transmitting medium 18. The seed portion 34 of the light-transmitting medium 18 is positioned on the base 20. In particular, the seed portion 34 of the light-transmitting medium 18 contacts the insulator 28. In some instances, when the light signal travels from the light-transmitting medium into the electro-absorption medium 27, a portion of the light signal enters the seed portion 34 of the light-transmitting medium 18 and another portion of the light signal enters the electro-absorption medium 27. During the fabrication of the device, the seed portion 34 of the light-transmitting medium 18 can be used to grow the electro-absorption medium 27. For instance, when the light-transmitting medium 18 is silicon and the electro-absorption medium 27 is germanium or germanium-silicon, the electro-absorption medium 27 can be grown on the silicon. As a result, the use of the light-transmitting medium 18 in both the waveguides 16 and as a seed layer for growth of the electro-absorption medium 27 can simplify the process for fabricating the device.

FIG. 1G is an alternative to the fourth structure illustrated in FIG. 1F. In FIG. 1G, the electro-absorption medium 27 is positioned on a seed portion 34 of the light-transmitting medium 18 without the seed portion 34 of the light-transmitting medium 18 extending substantially beyond the lateral sides of the electro-absorption medium 27. Additionally, the slab regions of the light-transmitting medium 18 are not present adjacent to the ridge of the electro-absorption medium 27. Accordingly, a portion of a waveguide includes a fourth structure where the waveguide is partially defined by the top and lateral sides of the electro-absorption medium 27. In some instances, when the light signal travels from the light-transmitting medium into the electro-absorption medium 27, a portion of the light signal enters the seed portion 34 of the light-transmitting medium 18 and another portion of the light signal enters the electro-absorption medium 27. As described above, the electro-absorption medium 27 can be grown on the seed portion of the light-transmitting medium 18.

FIG. 1H is an alternative to the fourth structure illustrated in FIG. 1F and FIG. 1G. In FIG. 1H, a ridge 22 of electro-absorption medium 27 extends upward from a slab region of the electro-absorption medium 27. Accordingly, a portion of a waveguide includes a fourth structure where the waveguide is partially defined by the top and lateral sides of the electro-absorption medium 27. The slab regions of the electro-absorption medium 27 and the ridge 22 of the electro-absorption medium 27 are both positioned on a seed portion 34 of the light-transmitting medium 18. As a result, the seed portion 34 of the light-transmitting medium 18 is between the electro-absorption medium 27 and the base 20. In some instances, when the light signal travels from the light-transmitting medium into the electro-absorption medium 27, a portion of the light signal enters the seed portion 34 of the light-transmitting medium 18 and another portion of the light signal enters the electro-absorption medium 27. As described above, the electro-absorption medium 27 can be grown on the seed portion of the light-transmitting medium 18.

As is evident in FIG. 1B, there is an interface between each facet of the electro-absorption medium 27 and a facet of the light-transmitting medium 18. The interface can have an angle that is non-perpendicular relative to the direction of propagation of light signals through the waveguide 16 at the interface. In some instances, the interface is substantially perpendicular relative to the base 20 while being non-perpendicular relative to the direction of propagation. The non-perpendicularity of the interface reduces the effects of back reflection. Suitable angles for the interface relative to the direction of propagation include but are not limited to, angles between 80° and 89°, and angles between 80° and 85°.

The portion of the base 20 adjacent to the light-transmitting medium 18 is configured to reflect light signals from the waveguide 16 back into the waveguide 16 in order to constrain light signals in the waveguide 16. For instance, the portion of the base 20 adjacent to the light-transmitting medium 18 can be an optical insulator 28 with a lower index of refraction than the light-transmitting medium 18. The drop in the index of refraction can cause reflection of a light signal from the light-transmitting medium 18 back into the light-transmitting medium 18. The base 20 can include the optical insulator 28 positioned on a substrate 29. As will become evident below, the substrate 29 can be configured to transmit light signals. For instance, the substrate 29 can be constructed of a light-transmitting medium 18 that is different from the light-transmitting medium 18 or the same as the light-transmitting medium 18. In one example, the device is constructed on a silicon-on-insulator wafer. A silicon-on-insulator wafer includes a silicon layer that serves as the light-transmitting medium 18. The silicon-on-insulator wafer also includes a layer of silica positioned on a silicon substrate. The layer of silica can serving as the optical insulator 28 and the silicon substrate can serve as the substrate 29.

The optical device includes a modulator 30. The location of the modulator on the optical device is illustrated by the line labeled K in FIG. 1B. In order to simplify FIG. 1B, the details of the modulator construction are not shown in FIG. 1B. However, the modulator construction is evident from other illustrations such as FIG. 1I. The modulator of FIG. 1I can be constructed on the portion of the waveguide having a fourth structure constructed according to FIG. 1F. The modulator is configured to apply an electric field to the electro-absorption medium 27 that is substantially parallel to the base 20 in order to phase and/or intensity modulate the light signals received by the modulator.

The electro-absorption medium 27 can include lateral sides 35 that connect a bottom side 36 and a top side 37. The bottom side is located between the top side and the base 20. In some instances, the lateral sides are substantially perpendicular relative to the base 20.

The lateral sides of the electro-absorption medium 27 can include doped regions 40. As is evident from FIG. 1I, each of the doped regions 40 can extend up to the top side of the electro-absorption medium 27. Each of the doped regions 40 can be an N-type doped regions or a P-type doped region. For instance, each of the N-type doped regions can include an N-type dopant and each of the P-type doped regions can include a P-type dopant. In some instances, the electro-absorption medium 27 includes a doped region 40 that is an N-type doped region and a doped region 40 that is a P-type doped region. The separation between the doped regions 40 in the electro-absorption medium 27 results in the formation of PIN (p-type region-insulator-n-type region) junction in the modulator 30.

In the electro-absorption medium 27, suitable dopants for N-type regions include, but are not limited to, phosphorus and/or arsenic. Suitable dopants for P-type regions include, but are not limited to, boron. The doped regions 40 are doped so as to be electrically conducting. A suitable concentration for the P-type dopant in a P-type doped region includes, but is not limited to, concentrations greater than $1\times10^{15}$ cm$^{-3}$, $1\times10^{17}$ cm$^{-3}$, or $1\times10^{19}$ cm$^{-3}$, and/or less than $1\times10^{17}$ cm$^{-3}$, $1\times10^{19}$ cm$^{-3}$, or $1\times10^{21}$ cm$^{-3}$. A suitable concentration for the N-type dopant in an N-type doped region includes, but is not limited to, concentrations greater than $1\times10^{15}$ cm$^{-3}$, $1\times10^{17}$ cm$^{-3}$, or $1\times10^{19}$ cm$^{-3}$, and/or less than $1\times10^{17}$ cm$^{-3}$, $1\times10^{19}$ cm$^{-3}$, or $1\times10^{21}$ cm$^{-3}$.

The light-transmitting medium 18 also includes doped regions 42. Each doped region 42 in the light-transmitting medium 18 contacts one of the doped regions 40 in the electro-absorption medium 27. A doped region 42 in the light-transmitting medium 18 and the contacted doped region 40 are the same type of doped region. For instance, when a doped region 40 in the electro-absorption medium 27 is a P-type region, that doped region 40 contacts a P-type doped region in the light-transmitting medium 18. As a result, in some instances, one of the doped regions 42 in the light-transmitting medium 18 is a P-type doped region and one of the doped regions 42 in the light-transmitting medium 18 is an N-type doped region.

In the light-transmitting medium 18, suitable dopants for N-type regions include, but are not limited to, phosphorus and/or arsenic. Suitable dopants for P-type regions include, but are not limited to, boron. The doped regions 42 are doped so as to be electrically conducting. A suitable concentration for the P-type dopant in a P-type doped region includes, but is not limited to, concentrations greater than $1\times10^{15}$ cm$^{-3}$, $1\times10^{17}$ cm$^{3}$, or $1\times10^{19}$ cm$^{-3}$, and/or less than $1\times10^{17}$ cm$^{-3}$, $1\times10^{19}$ cm$^{-3}$, or $1\times10^{21}$ cm$^{-3}$. A suitable concentration for the N-type dopant in an N-type doped region includes, but is not limited to, concentrations greater than $1\times10^{15}$ cm$^{-3}$, $1\times10^{17}$ cm$^{-3}$, or $1\times10^{19}$ cm$^{-3}$, and/or less than $1\times10^{17}$ cm$^{-3}$, $1\times10^{19}$ cm$^{-3}$, or $1\times10^{21}$ cm$^{-3}$.

Each doped region 42 in the light-transmitting medium 18 is in contact with an electrical conductor 44 such as a metal. Accordingly, the each of the doped regions 42 in the light-transmitting medium 18 provides electrical communication between an electrical conductor 44 and one of the doped regions 40 in the electro-absorption medium 27. As a result, electrical energy can be applied to the electrical conductors 44 in order to apply the electric field to the electro-absorption medium 27. As is evident from the arrows labeled E in FIG. 1I, the doped regions 40 in the electro-absorption medium 27 serve as the field sources for the electrical field. As a result, the resulting electrical field is substantially parallel to the base 20.

Figure 2A:
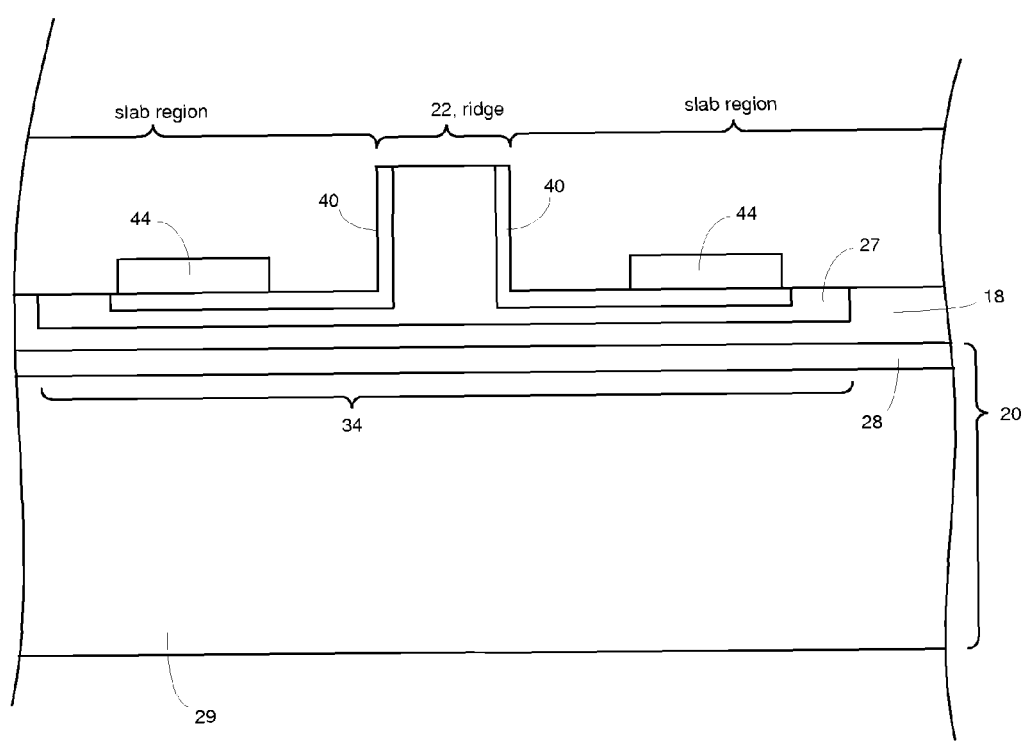
FIG. 2A is a cross section of an embodiment of a modulator that can be constructed on a waveguide having a structure constructed according to FIG. 1H.

FIG. 2A presents another construction of the modulator that can simplify the fabrication process. The modulator of FIG. 2A can be constructed on the portion of the waveguide having a fourth structure constructed according to FIG. 1H.

A ridge 22 of electro-absorption medium 27 extends upward from a slab region of the electro-absorption medium 27. The doped regions 40 are both in the slab regions of the electro-absorption medium 27 and also in the ridge of the electro-absorption medium 27. For instance, doped regions 40 of the electro-absorption medium 27 are positioned on the lateral sides of the ridge 22 of the electro-absorption medium 27. Additionally, the doped regions 40 extend from the ridge 22 into the slab region of the electro-absorption medium 27. The transition of a doped region 40 from the ridge 22 of the electro-absorption medium 27 into the slab region of the electro-absorption medium 27 can be continuous and unbroken as shown in FIG. 2A.

Electrical conductors 44 are positioned on the slab region of the electro-absorption medium 27. In particular, the electrical conductors 44 each contact a portion of a doped region 40 that is in the slab region of the electro-absorption medium 27.

The arrangement of FIG. 2A may have a simplified fabrication process relative to an arrangement such as illustrated in FIG. 1I. For instance, in FIG. 1I, doped regions 40 are formed in the light-transmitting medium 18 and also in the electro-absorption medium 27. Different conditions may be required to form these regions in the different materials. For instance, when the light-transmitting medium 18 is silicon and the electro-absorption medium 27 is germanium, it may be desirable to use different temperatures to form the doped regions 40 in the electro-absorption medium 27 than is used to form the doped regions 42 in the light-transmitting medium 18. However, since the arrangement of FIG. 2A requires that the doped regions be formed only in the electro-absorption medium, the arrangement of FIG. 2A may be simpler to fabricate.

Although FIG. 2A illustrates each of the doped regions extending only part way into slab regions of the electro-absorption medium, one or more of the doped regions can extend through the slab regions of the electro-absorption medium. Accordingly, one or more of the doped regions can contact the light-transmitting medium 18. Further, one or more of the doped regions can extend through the slab regions of the electro-absorption medium and into the light-transmitting medium 18.

Figure 2B:
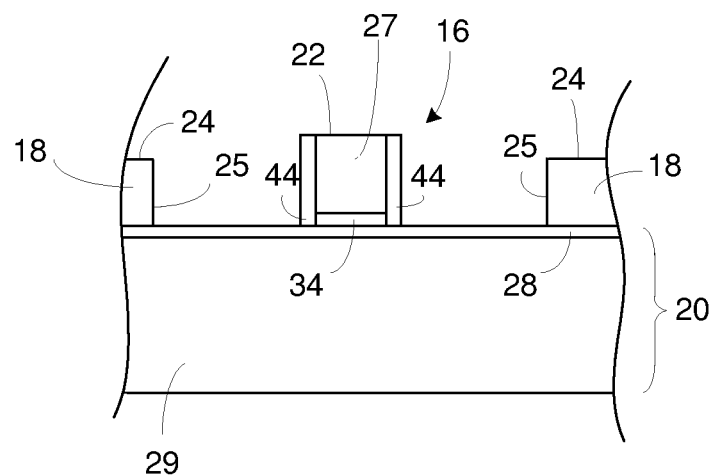
FIG. 2B is a cross section of an embodiment of a modulator that can be constructed on a waveguide having a structure constructed according to FIG. 1G.

Rather than using doped regions 40 in the electro-absorption medium 27 as the field sources, electrical conductors 44 such as metal can be used as the field sources. For instance, FIG. 2B is a cross-section of a modulator that employs electrical conductors 44 as field sources. The modulator of FIG. 2B can be constructed on the portion of the waveguide having a fourth structure constructed according to FIG. 1G. The electrical conductors 44 extend from the base 20 to the top side of the electro-absorption medium 27. For instance, FIG. 2B illustrates the electrical conductors 44 extending from the insulator 28 to the top side of the electro-absorption medium 27. The seed portion 34 of the light-transmitting medium 18 is between the base 20 and the electro-absorption medium 27.

Figure 2C:
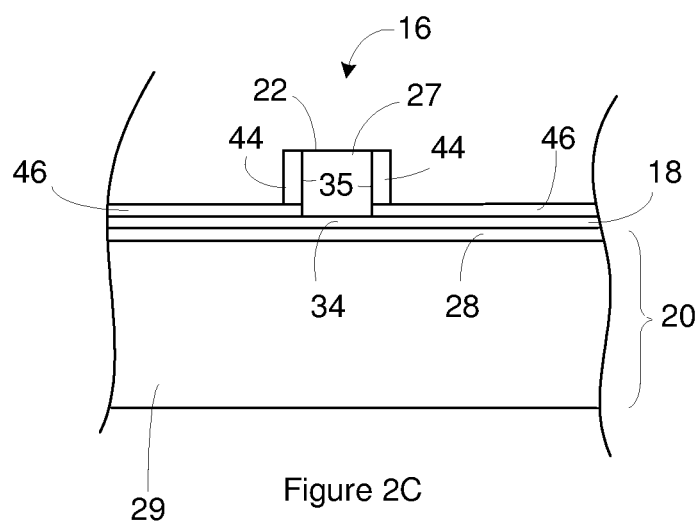
FIG. 2C is a cross section of an embodiment of a modulator that can be constructed on a waveguide having a structure constructed according to FIG. 1F.

As is evident from FIG. 2B, the electrical conductors 44 can contact the base 20. However, the electrical conductors 44 can be spaced apart from the base 20 as illustrated in FIG. 2C. The modulator or FIG. 2C can be constructed on the portion of the waveguide having a fourth structure constructed according to FIG. 1F. In FIG. 2C, a spacer layer 46 is formed on top of the light-transmitting medium 18 and against the lateral sides of the electro-absorption medium 27. The electrical conductors 44 extend from the top of the spacer layer 46 to the top side of the electro-absorption medium 27. As a result, the spacer layer 46 elevates the bottom of the electrical conductors 44 relative to the base 20. The electrical conductors 44 are also elevated above the interface between the electro-absorption medium 27 and the seed portion 34 of the light-transmitting medium 18. The elevation of the electrical conductors 44 reduces interaction between the resulting electrical field and the interface between the electro-absorption medium 27 and the seed portion 34 of the light-transmitting medium 18.

During operation of the modulators of FIG. 1A through FIG. 2C, electronics 47 (FIG. 1A) can be employed to apply electrical energy to the field sources so as to form an electrical field in the electro-absorption medium. For instance, the electronics can form a voltage differential between the field sources. The electrical field can be formed without generating a significant electrical current through the electro-absorption medium 27. The electro-absorption medium can be a medium in which the Franz-Keldysh effect occurs in response to the application of the electrical field. The Franz-Keldysh effect is a change in optical absorption and optical phase by an electro-absorption medium 27. For instance, the Franz-Keldysh effect allows an electron in a valence band to be excited into a conduction band by absorbing a photon even though the energy of the photon is below the band gap. To utilize the Franz-Keldysh effect the active region can have a slightly larger bandgap energy than the photon energy of the light to be modulated. The application of the field lowers the absorption edge via the Franz-Keldysh effect and makes absorption possible. The hole and electron carrier wavefunctions overlap once the field is applied and thus generation of an electron-hole pair is made possible. As a result, the electro-absorption medium 27 can absorb light signals received by the electro-absorption medium 27 and increasing the electrical field increases the amount of light absorbed by the electro-absorption medium 27. Accordingly, the electronics can tune the electrical field so as to tune the amount of light absorbed by the electro-absorption medium 27. As a result, the electronics can intensity modulate the electrical field in order to modulate the light signal. Additionally, the electrical field needed to take advantage of the Franz-Keldysh effect generally does not involve generation of free carriers by the electric field.

Suitable electro-absorption media 27 include semiconductors. However, the light absorption characteristics of different semiconductors are different. A suitable semiconductor for use with modulators employed in communications applications includes $Ge_{1-x}Si_x$ (germanium-silicon) where x is greater than or equal to zero. In some instances, x is less than 0.05, or 0.01. Changing the variable x can shift the range of wavelengths at which modulation is most efficient. For instance, when x is zero, the modulator is suitable for a range of 1610-1640 nm. Increasing the value of x can shift the range of wavelengths to lower values. For instance, an x of about 0.005 to 0.01 is suitable for modulating in the c-band (1530-1565 nm).

Strain can optionally be placed on the electro-absorption media 27 in other to shift the range of wavelengths at which modulation is most efficient. For instance, increased tensile strain can shift the range of suitable modulation wavelengths to longer wavelengths. A number of techniques can be employed to place strain on the electro-absorption medium 27. For instance, thermally induced strain can be created during the growth of the electro-absorption medium 27 on the seed portion 34 of the light-transmitting medium 18. In this case the strain results from the different lattice structures between the electro-absorption medium 27 and the seed portion 34. Additionally or alternately, a layer of strain-inducing material can be grown or deposited on the top of the electro-absorption medium 27. The strain-inducing medium can be selected such that the difference in the lattice structures of the electro-absorption medium 27 and the strain-inducing medium provide the strain on the strain-inducing medium. When the electro-absorption medium 27 is germanium or germanium-silicon, suitable strain-inducing media include, but are not limited to, dielectrics such as $SiO_2$, and SiN, and metals such as aluminum. The strain-inducing medium can contact the electro-absorption medium 27 but need not. For instance, the strain-inducing medium can be positioned on the bottom of the substrate 29. In this instance, the strain-inducing medium can be selected such that the difference in the lattice structures of the strain-inducing medium and the substrate 29 can cause the device to bend and accordingly strain the electro-absorption medium 27. When the substrate 29 is silicon, suitable strain-inducing media include, but are not limited to, dielectrics such as $SiO_2$, and SiN, and metals such as aluminum.

The composition and level of strain placed on the electro-absorption medium 27 can be selected such that the electro-absorption medium 27 is a direct band gap material rather than an indirect band gap material.

The modulator can also be used as a phase modulator. For instance, the electronics (not shown) can be employed to apply electrical energy to the field sources so as to form a phase modulation electrical field in the electro-absorption medium. The phase modulation electrical field can change the index of refraction of the electro-absorption medium 27. As a result, tuning of the phase modulation electrical field can tune the speed at which the light signal travels through the modulator. A phase modulation electrical field can be different from the intensity modulation electrical field described above in that a phase modulation electrical field is generally weaker than the electrical field used for intensity modulation. Further, there may be some degree of phase modulation associated with the intensity modulation described above.

Increasing the portion of the lateral side of the ridge electro-absorption medium 27 that is contacted by the field source can increase the efficiency of the modulator. Accordingly, as is evident in FIG. 1A, FIG. 2B, and FIG. 2A, each of the field sources can span the distance between the top of the lateral side contacted by the field source and the bottom of the lateral side contacted by the field source. In some instances, each of the field sources extends from the top of the lateral side contacted by the field source toward the base 20. Alternately, each of the field sources can extend toward the base 20 from a location that is above 90% of a distance between the top of the lateral side contacted by the field source and the bottom of the lateral side contacted by the field source. Each of the field sources can extend toward the base 20 from a location that is above 80% of a distance between the top of the lateral side contacted by the field source and the bottom of the lateral side contacted by the field source. In one example, each of the field sources extends toward the base 20 from a location that is within 1.0 μm of a top of the lateral side contacted by that field source.

The width of the portion of the waveguide having the fourth structure can affect the performance of the modulator. The width of the waveguide or a portion of the waveguide refers to the width of that defines the waveguide in that portion of the waveguide. For instance, the width of the top of the ridge of electro-absorption medium 27 in the modulator can affect the modulation speed. A narrower width can provide faster modulation speeds. A suitable width for the top of the ridge of electro-absorption medium 27 in the modulator includes, but is not limited to, widths greater than 0.2 μm, 0.5 μm, and 0.75 μm, and/or less than 1.25 μm, 1.5 μm, and 2 μm. An example of a preferred width for the top of the ridge of electro-absorption medium 27 in the modulator is 1 μm.

Figure 3A:
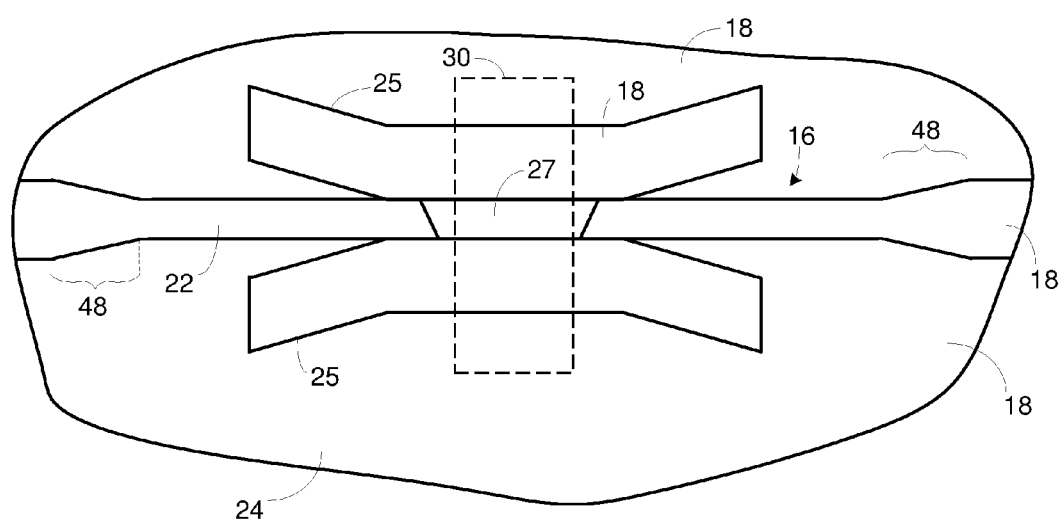
FIG. 3A is a topview of the optical device of FIG. 1B where the waveguide includes horizontal tapers and excludes vertical tapers.
Figure 3B:
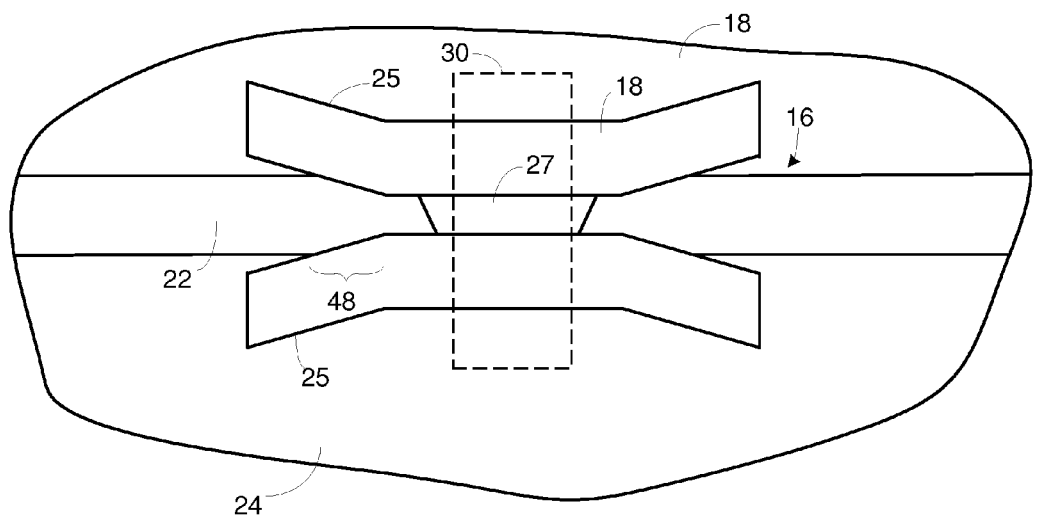
FIG. 3B is a topview of another embodiment of an optical device where the waveguide includes vertical tapers.

The width of the waveguide can include horizontal tapers configured such that the electro-absorption medium 27 has the desired width in the modulator. For instance, FIG. 3A is a topview of an optical device where the waveguide 16 includes tapers 48. The tapers 48 can be a horizontal taper and need not include a vertical taper although a vertical taper is optional. One of the tapers 48 is positioned before the modulator and can taper the waveguide to the width that is desired for the electro-absorption medium 27 in the modulator. Another taper 48 is positioned after the modulator and can return the waveguide to the desired dimensions. As is evident in FIG. 3B, the sides of the taper can be defined by the sides of the recesses 25.

In some instances, the horizontal tapers occur in the light-transmitting medium 18 rather than in the electro-absorption medium 27. The horizontal tapers can each be between a portion of the waveguide having the first structure and an expanded portion of the waveguide. The optical device preferably excludes additional components between the tapers and modulator although other components may be present.

The expanded portion of the waveguide can be either multi-mode or single mode. Additionally, the portions of the waveguide having the first structure can be single mode or multi-mode. The portions of the waveguide having the third structure can be multi-mode or single mode. However, even when the portions of the waveguide having the first structure are single mode, the portions of the waveguide having the third structure can become vertically multimode as a result of the ridge having an increased height relative to the height of the ridge in the portions of the waveguide having the first structure. In general, the portion of the waveguide having the fourth structure is single mode when the portions of the waveguide having the third structure are single mode and the portion of the waveguide having the fourth structure is multi-mode when the portions of the waveguide having the third structure are multi-mode.

In view of the above, the portions of the waveguide having the second structure can be a transition between a portion of the waveguide that is single mode and a portion of the waveguide that is at least vertically multi-mode. In these instances, the distance between the recess and the ridge can taper so as to reduce excitation of higher order modes during this transition. In instances, where the portions of the waveguide having the second structure do not provide a transition between a portion of the waveguide that is single mode and a portion of the waveguide that multi-mode, the distance between the recess and the ridge can also taper so as to reduce excitation of higher order modes.

Since the electrical field that forms as a result of using the above structures is substantially parallel to the base, changing the height of the electro-absorption medium 27 in the modulator does not substantially increase the modulation speed. As a result, there is no need for a vertical taper between large dimension waveguides and the modulator. Accordingly, the portions of the waveguide having the second structures, the third structures and the fourth structure can each exclude a vertical taper.

As noted above, the modulator is suitable for use with waveguide dimensions that are suitable for use in communications applications. Accordingly, a suitable height (distance between top of ridge 22 and the base) for the portion of the waveguide 16 having the first structure (FIG. 1C) includes, but is not limited to, heights greater than 1 μm, 2 μm, and 3 μm. A suitable width of the ridge for the portion of the waveguide 16 having the first structure (FIG. 1C) includes, but is not limited to, widths greater than 0.25 μm, 0.5 μm, and 0.75 μm.

Since the portions of the waveguide having the second structures, the third structures and the fourth structure can each exclude a vertical taper, the height (distance between top of ridge 22 and the base) of each of these portions of the waveguide can be about the same. In some instance, the height (distance between top of ridge 22 and the base) of the portions of the waveguide having the first structure is the same as the height of the second structures, the third structures and the fourth structure.

A suitable depth for the recesses to extend into the slab region of the light-transmitting medium includes but is not limited to, depths greater than 1.5 μm, 2.5 μm, and 3 μm and/or less than 3.5 μm, 4 μm, and 4.5 μm. A suitable height for the ridge (distance between the top of the ridge and the top of the slab portions of the light-transmitting medium) in the portions of the waveguide having the first structure include, but are not limited to, heights greater than 2 μm, 3 μm, and 3.5 μm, and/or less than 4 μm, 4.5 μm, and 5 μm.

As noted above, the electro-absorption media can include semiconductors such as $Ge_{1-x}Si_x$ (germanium-silicon) where x is greater than or equal to zero. These semiconductors can have different compositions. For instance, the ratio of the different elements that make up the semiconductor can vary. As an example, changing the value of x in $Ge_{1-x}Si_x$ changes the ratio of Ge:Si in the semiconductor and accordingly changes the composition of the electro-absorption media.

The composition of these electro-absorption media can affect the performance of components such as the modulator disclosed above. For instance, the modulation wavelength of the above modulator can change in response to varying the value of x in $Ge_{1-x}Si_x$. The modulation wavelength of a modulator is the wavelength that the modulator modulates most efficiently. Accordingly, the wavelength of light that is most efficiently modulated by the above modulators can be controlled by controlling the composition of the electro-absorption medium.

The inventors have found a method for controlling the composition of the electro-absorption medium when methods such as epitaxial growth are used to form the electro-absorption medium on the device. Epitaxial growth of the electro-absorption media occurs when an ordered layer of the electro-absorption media is grown on a substrate such as a crystalline substrate. The electro-absorption media grown by epitaxial growth can also be crystalline. Suitable methods of epitaxial growth include the variant of chemical vapor deposition known as vapor-phase epitaxy, molecular beam epitaxy, liquid-phase epitaxy.

The inventors have found that the composition of electro-absorption media can be controlled through the use of dummy regions that include dummy electro-absorption medium. Dummy electro-absorption medium can be formed on the device at the same time as the electro-absorption medium included in components such as an attenuator; however, dummy electro-absorption medium is not a functional part of a component on the device. For instance, electrical energy is not applied to the dummy electro-absorption media in order to process light signals that are being processed by the device and/or light signals being processed by the device are not intentionally directed to the dummy electro-absorption media for processing by the device. As an example, waveguides do not guide light signals to and/or through the dummy electro-absorption medium. As another example, electrical energy is not intentionally applied directly to the dummy electro-absorption medium.

Figure 4A:
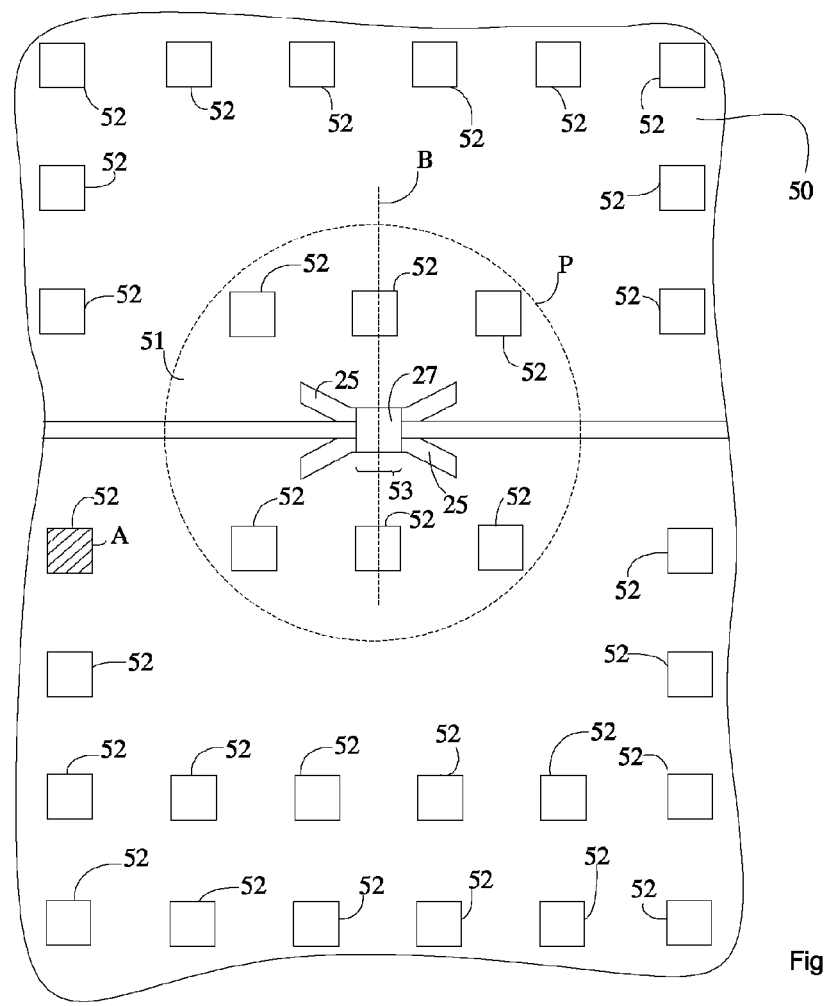
FIG. 4A and FIG. 4B illustrate the use of dummy regions.
Figure 4B:
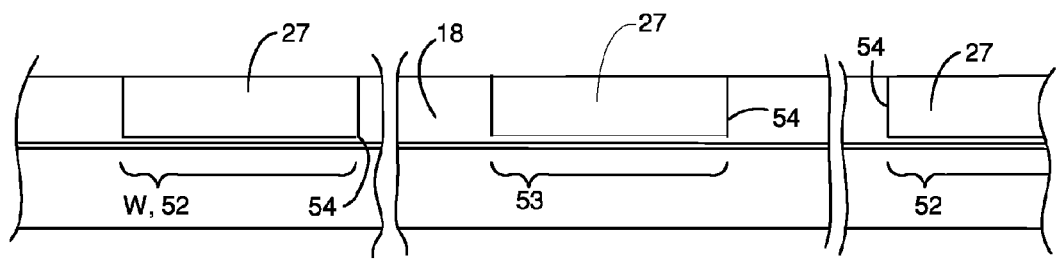

FIG. 4A and FIG. 4B illustrate the use of dummy regions 52. FIG. 4A is a topview of a device such as the device of FIG. 1B but with more of the device shown. Rather than illustrating details of a component such as the modulator of FIG. 2A, FIG. 4A illustrates a component region 53 where electro-absorption medium that will be the source of the electro-absorption medium in the final component will be formed. FIG. 4B is a cross section of the device shown in FIG. 4A taken along the line labeled B. The component region 53 is located within a common zone 50 and a local zone 51. The local zone 51 is a zone that is close to the component region 53 and/or surrounds the component region. The perimeter of the local zone shown in FIG. 4A is illustrated by the dashed line labeled P in FIG. 4A. Although FIG. 4A illustrates the device as including a single component region 53, the device can include one or more component regions 53 and accordingly one or more local zones 51. The common zone 50 is the portion of the device that is located outside of the one or more local zones 51 on the device.

In FIG. 4A, the common zone 50 and the local zone 51 both include dummy regions 52. The dummy regions 52 are regions of the device that include dummy electro-absorption medium that is not a functional part of a component on the device. The electro-absorption medium included in the dummy regions 52 can be formed on the device at the same time as the electro-absorption medium included in one or more component regions 53 on the device. Accordingly, the chemical elements that are present in the electro-absorption medium that is included in a component region 53 and the dummy regions 52 within a local zone 51 can be the same. Additionally, the composition of the electro-absorption medium included in a component region 53 and the dummy regions 52 within the local zone 51 can be the same or substantially the same. Alternately, the composition of the electro-absorption medium included in a component region 53 and the dummy regions 52 within a local zone 51 component 49 can vary within the local zone. For instance, the composition near the perimeter of the local zone 51 can be different from the composition near the component region 53. As an example, the composition of the dummy regions 52 near the perimeter of the local zone 51 can be different from the composition in the component region 53.

The dummy regions 52 in a local zone 51 can be arranged so they surround the component 49 in that they are positioned on all sides of the component 49. For instance, an imaginary line can be drawn from a dummy region 52 on one side of the component 49 to a dummy region 52 on the opposing side of the component 49. In some instances, the concentration of the dummy regions 52 (number or area of dummy regions 52/device area) is uniform or substantially uniform across a local zone 51. As a result, the dummy regions 52 in a local zone 51 and/or a common zone 50 can optionally have a periodic, substantially periodic, patterned, or substantially patterned arrangement. For instance, the dummy regions 52 can be regularly spaced and/or have a regular displacement in a local zone 51 and/or a common zone 50. In some instances, the concentration of the dummy regions 52 can vary within a local zone 51. For instance, the concentration of dummy zones within the local zone 51 can increase closer to the component 49. The concentration of the dummy regions 52 in the common zone 50 can be uniform or substantially uniform across the one or more common zones 50 on the device.

Figure 4C:
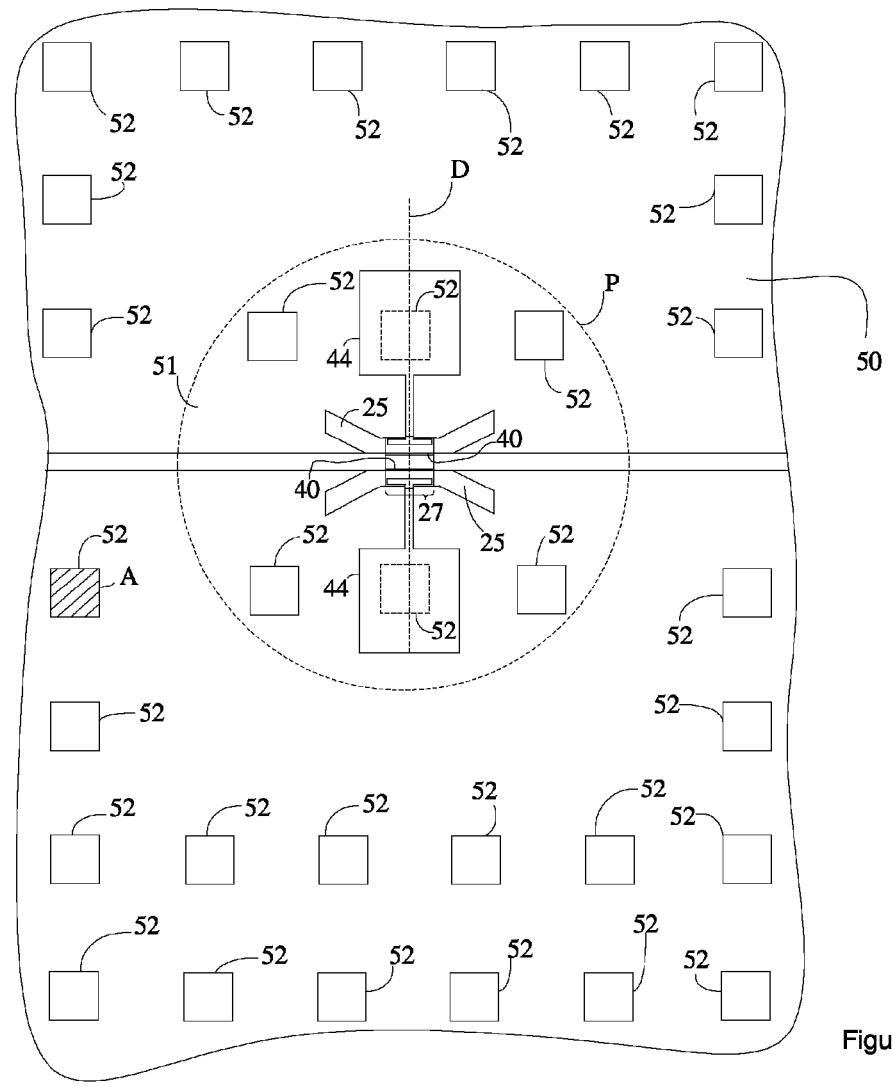
FIG. 4C and FIG. 4D illustrate the device of FIG. 4A and FIG. 4B including a modulator constructed according to FIG. 2A. The modulator includes one or more electrical conductors positioned over one or more of the dummy regions.

A variety of different optical components can be formed using the electro-absorption medium included in the component region 53 on the device of FIG. 4A and FIG. 4B. As an example, the device of FIG. 4C and FIG. 4D includes a modulator that uses the electro-absorption medium from the component region 53 on the device of FIG. 4A and FIG. 4B. FIG. 4C is a topview of the device and FIG. 4D is a cross section of the device taken along the line labeled D in FIG. 4C.

Figure 4D:
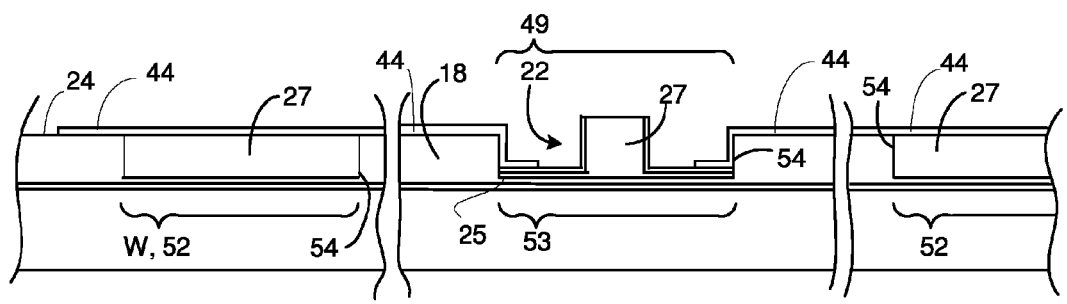

The modulator of FIG. 4C and FIG. 4D is a modulator constructed according to FIG. 2A. The ridge 22 of the electro-absorption medium 27 is formed from the electro-absorption medium 27 that was included in the component region 53 of FIG. 4A and FIG. 4B.

The electrical conductors for operating a component can optionally be positioned over one or more of the dummy regions. For instance, the electrical conductor 44 illustrated in FIG. 4C and FIG. 4D includes contact pads 55 that can be used for connecting the modulator to the electronics. For instance, one or more of the electrical conductors can extend out of a recess 25 to a contact pad positioned on top of trench 24 as is most evident in FIG. 4D. One or more of the electrical conductors 44 is positioned over one or more of the dummy regions 52. For instance, one or more of the contact pads 55 is positioned over one or more of the dummy regions. Accordingly, a dummy region 52 can be positioned between an electrical conductor 44 and the base. In FIG. 4C, the location of a dummy region 52 under a contact pad 55 is illustrate by dashed lines.

Figure 4F:
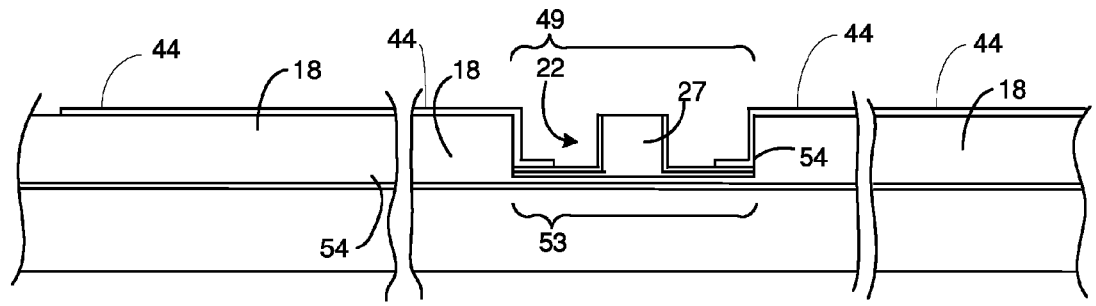
FIG. 4E and FIG. 4F illustrate the device of FIG. 4A and FIG. 4B including a modulator constructed according to FIG. 2A. The modulator includes one or more electrical conductors but none of the electrical conductors is positioned over a dummy regions.
Figure 4E:
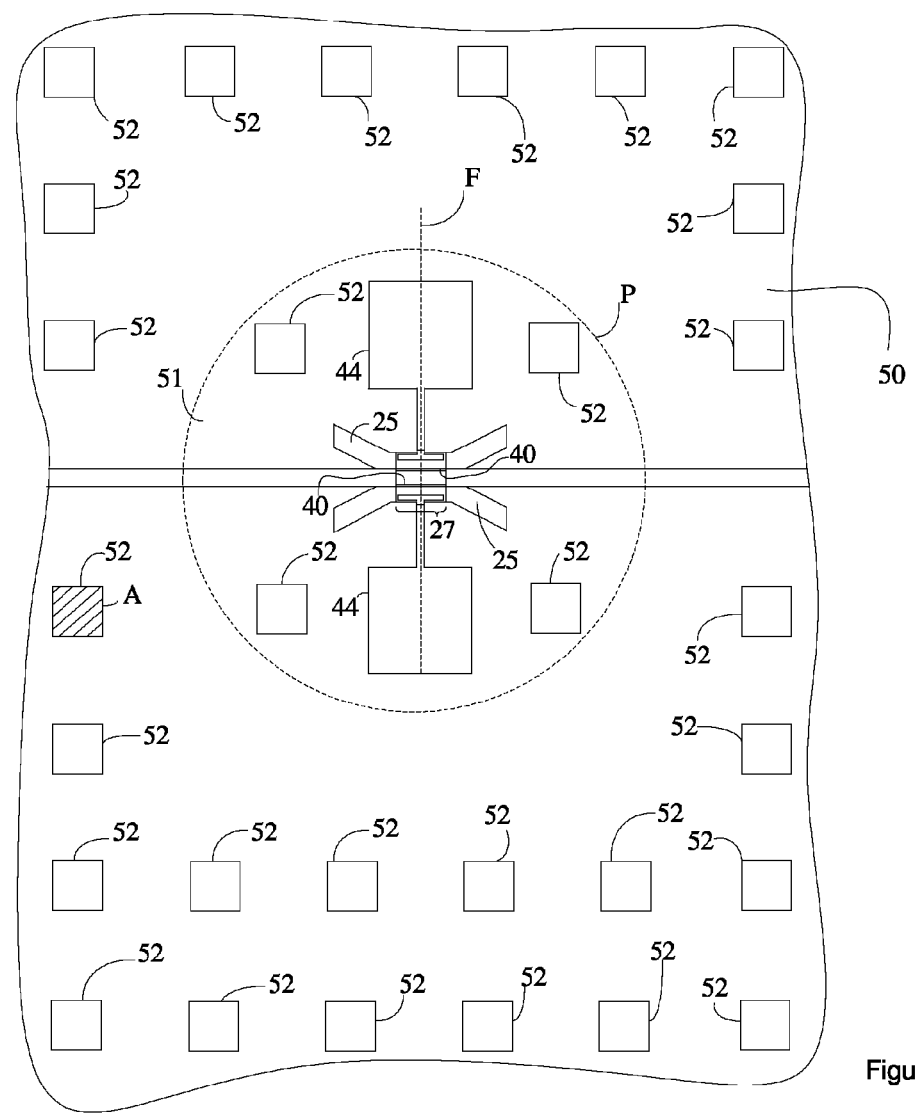

The electrical conductors used to operate a component need not be positioned over the dummy regions. For instance, FIG. 4E and FIG. 4F illustrate an embodiment of the device where the electrical conductors include contact pads 55 that can be used for connecting the modulator. FIG. 4E is a topview of the device and FIG. 4F is a cross section of the device taken along the line labeled F in FIG. 4E. The device includes a modulator constructed according to FIG. 2A. The modulator of FIG. 4C and FIG. 4D is a modulator constructed according to FIG. 2A. The ridge 22 of the electro-absorption medium 27 is formed from the electro-absorption medium 27 that was included in the component region 53 of FIG. 4A and FIG. 4B. During fabrication of the device, the one or more dummy regions 52 in the common zone 50 and/or local zone 51 are not formed in the locations over which the electrical conductor 44 will be positioned. Refraining from placing one or more dummy regions can disrupt the regular or desired pattern of the dummy regions 52 in the common zone 50 and/or local zone 51.

FIG. 4C through FIG. 4F use the modulator of FIG. 2A for the purposes of illustration. As a result, the electrical conductor arrangement disclosed in the context of FIG. 4C through FIG. 4F can be applied to other modulators, other modulators disclosed above and components other than modulators.

Figure 4G:
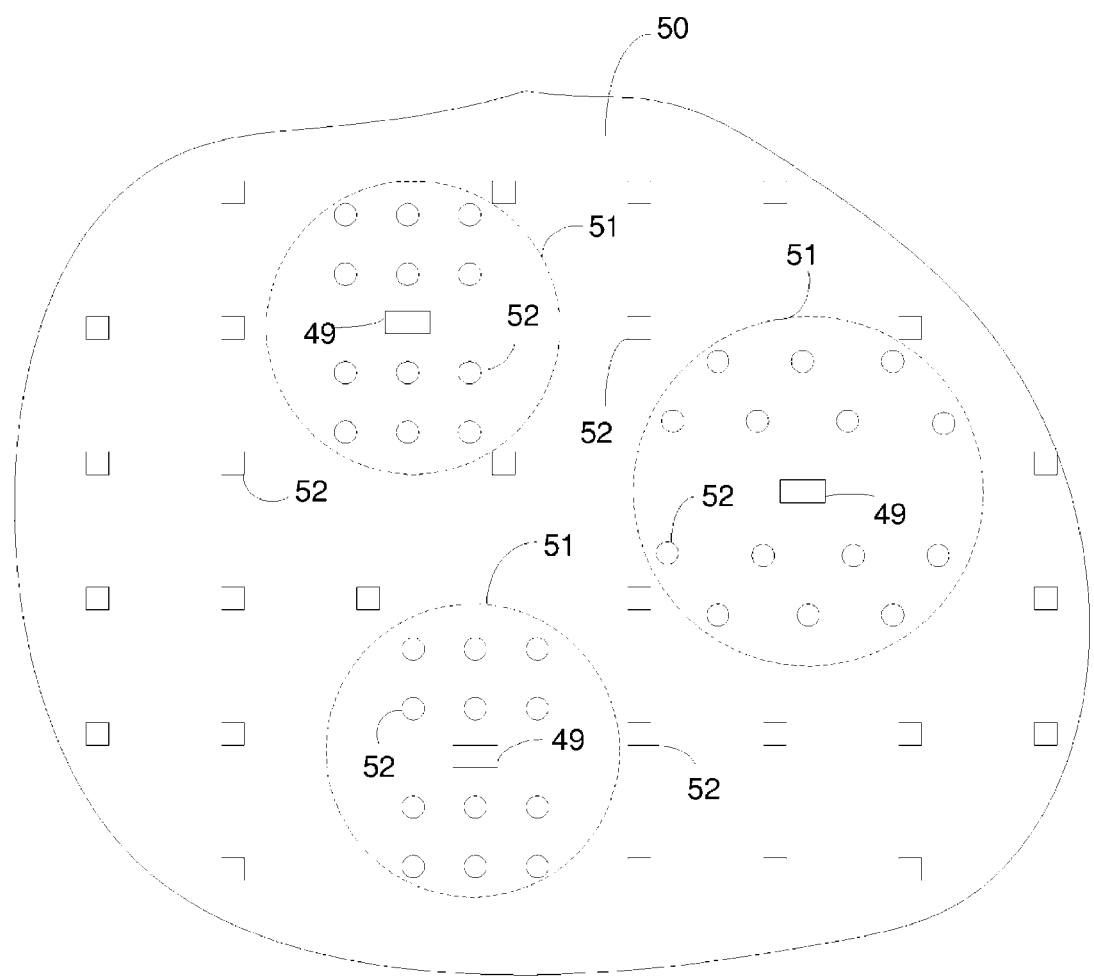
FIG. 4G is a topview of a portion of the device that includes multiple optical components.

Although FIG. 4A through FIG. 4F illustrate a single local zone on the device, in some instances, the device includes multiple local zones. For instance, when the device includes more than one component 49, each of the components 49 can be associated with its own local zone 51 as shown in FIG. 4G. FIG. 4G is a topview of a portion of the device that includes multiple optical components 49. Although not illustrated, the optical components can optionally be in optical communication with one another and/or with other components on the device. For instance, waveguides (not shown) can provide optical communication between the different components on the device. One or more variables selected from concentration, number, arrangement and size of the dummy regions 52 within the different local zones 51 can be the same or different. Additionally or alternately, the size of the different local zones on the same device can be the same or different.

The area over which the electro-absorption medium is formed on the device is related to the composition of the electro-absorption medium. For instance, when the electro-absorption medium is epitaxially grown $Ge_{1-x}Si_x$, the percentage of Si in the electro-absorption medium increases as the area over which the electro-absorption medium is formed increases. Without being bound to theory, this is believed to be a result of microloading.

The composition of the electro-absorption medium included in a component 49 is affected by the percentage of the local zone 51 in which the electro-absorption medium is formed. The area over which the electro-absorption medium is formed on the device is the formation area. The formation area includes two different types of area because the electro-absorption medium is formed on both the dummy regions 52 and also in a component region 53. The dummy area is the area of the dummy region 52 on which the electro-absorption medium is formed. The dummy regions 52 illustrated in FIG. 4A and FIG. 4B include an electro-absorption cavity 54 extending into or through the light-transmitting medium 18. The electro-absorption medium is formed in the bottom of the electro-absorption cavities 54. As a result, the dummy area is the area of the bottom of the electro-absorption cavities 54. The dummy regions 52 need not include an electro-absorption cavity 54. For instance, the electro-absorption medium can be formed on the upper surface of the light-transmitting medium 18 rather that in an electro-absorption cavity 54.

As noted above, the formation area also includes the area of a component region 53. The component region 53 is the location where the electro-absorption medium that is to be included in a component is formed on the device. As is evident in FIG. 4B, the component region 53 is defined by an electro-absorption cavity 54 extending into or through the light-transmitting medium 18. The electro-absorption medium is formed in the bottom of the electro-absorption cavity 54 for the component region 53. In the final device, electro-absorption medium may not cover all of the bottom of the electro-absorption cavity 54 because all or a portion of the electro-absorption medium can be removed after the electro-absorption medium is formed on the device. As a result, the location of the electro-absorption medium on FIG. 4A may or may not be the same as the illustrated component region 53. The component region 53 can have a shape and/or size that is the same as or different from one or more of the dummy regions 52. In some instances, the formation area is the total area of the upper surface of the electro-absorption medium included in each of the dummy regions 52 plus the area of the bottom of the component regions 53 or is the total area of the bottom dummy regions 52 plus the area of the bottom of the component regions 53.

In some instances, the formation area is configured such that the electro-absorption medium is formed in more than 1%, 5%, 10%, 20%, or 30% and/or less than 40%, 50%, or 60% in each one of one or more of the one or more local zones 51 on the device. The dummy regions 52 and/or the electro-absorption medium included in the dummy regions 52 can occupy more than 1%, 5%, 20%, or 30% and/or less than 40%, 50%, or 60% in each one of one or more of the one or more local zones 51 on the device. Suitable dimensions for a local zone 51 include a zone falling within 5000 µm, 2000 µm, 1000 µm, 500 µm, or 250 µm of the perimeter of the component region 53 or from the center of the component region 53.

The presence of the dummy regions 52 in the common zone(s) 50 can reduce the effects of stress on the device. For instance, having highly localized areas where the electro-absorption medium is situated can cause local stress on the device. The dummy regions 52 can be placed in the common zone 50 so as to even out the distribution of electro-absorption medium across the device. The formation area can be a higher or lower percentage of the local zones 51 than of the one or more common zones 50. In some instances, the formation area is configured such that the electro-absorption medium is formed in more than 5%, 10%, or 20% and/or less than 30%, 40%, or 50% of each of one or more of the one or more common zones 50 on the device. In some instances, the formation area is configured such that the electro-absorption medium is formed in more than 5%, 20%, or 30% and/or less than 40%, 50%, or 60% each of one or more of the one or more local zones 51 on the device and the electro-absorption medium is formed in more than 10%, 30%, or 50% and/or less than 60%, 70%, or 80% of each of one or more of the one or more common zones 50 on the device.

As noted in the discussion of FIG. 4C through FIG. 4F, there are circumstance where it may be desirable to disrupt a regular positioning of the dummy regions in the common zone 50 and/or local zone 51. For instance, if it is not desirable to locate one or more electrical conductors over a dummy region 52, it is possible to fabricate the device without locating dummy regions 52 under the location(s) that will be occupied by the electrical conductors. The decision to refrain from creating one or more dummy regions can disrupt the regularity, pattern, or periodic spacing of the dummy regions in the common zone 50 and/or local zone 51. Surprisingly, in some instances, this disruption in the pattern of the dummy regions 52 can make the composition of the electro-absorption medium 27 in the component region 53 more difficult to predict and/or control. As a result, in some instances, it is desirable for the regularity, pattern, or periodic spacing of the dummy regions to be retained. Accordingly, it may be desirable for one or more of the electrical conductors associated with an optical component to each be located over one or more of the dummy regions.

Rather than having a number of dummy regions 52, it may be possible to increase the size of the component region 53 to the desired formation area and eliminate the dummy regions 52. However, when the device includes multiple modulators, it is often desirable for different modulators to modulate at different wavelengths. As a result, it would be desirable to have the component regions 53 for different modulators be different sizes. This may introduce undesirable levels of variation in the other characteristics of the modulators. Additionally, the variation in the size of the different component regions 53 can introduce additional stress into the device. As a result, it is generally desirable to include dummy regions 52 in the one or more local zones 51 and/or the one or more common zones 50 on the device.

The width of one of the dummy areas is labeled W in FIG. 4B and area of the dummy region 52 labeled A in FIG. 4A is illustrated by the diagonal lines. The dummy regions 52 can be selected such that largest dimension of the dummy regions 52 is less than 100 µm, 50 µm, or 25µ. For instance, the dummy regions 52 can be selected such that the diameter or diagonal of the dummy regions 52 is less than 100 µm, 50 µm, or 25µ. In some instances, the largest dimension of one or more of the local zones 51 on the device is less than 2000 µm, 1000 µm or 500 µm. In some instances, the one or more local zones 51 on the device each includes more than 2, 3, or 4 dummy regions 52. In some instances, the one or more local zones 51 on the device each includes more than 2, 3, or 4 dummy regions 52, and/or the largest dimension of one or more of the local zones 51 on the device is less than 2000 µm, 1000 µm or 500 µm, and/or the largest dimension of at least a portion of the dummy regions 52 is less than 100 µm, 50 µm, or 25µ.

The optical device can be constructed using fabrication technologies that are employed in the fabrication of integrated circuits, optoelectronic circuits, and/or optical devices. FIG. 5A through FIG. 14 illustrate a method of forming an optical device having a modulator constructed according to FIG. 1A through FIG. 1F, and FIG. 1I. The method is illustrated using a silicon-on-insulator wafer or chip as the starting precursor for the optical device. However, the method can be adapted to platforms other than the silicon-on-insulator platform.

Figure 5A:
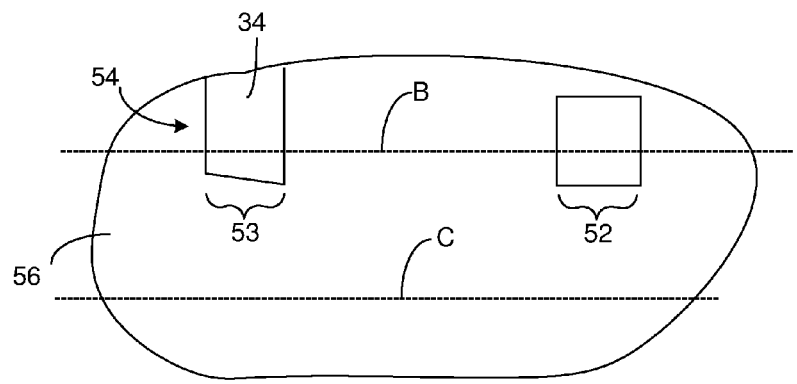
Figure 5C:
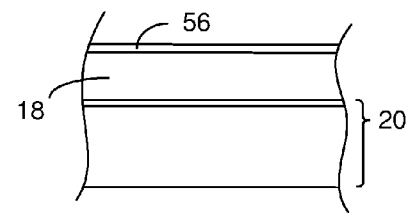
Figure 5B:
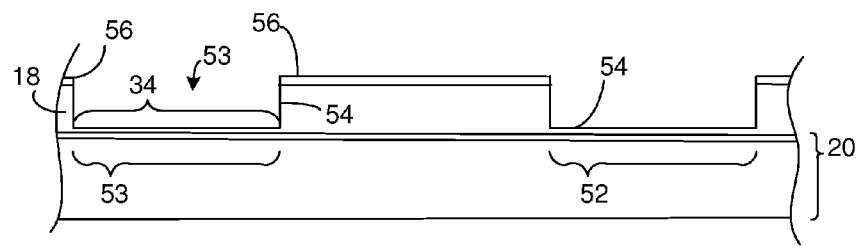

FIG. 5A through FIG. 5C illustrate a first mask 56 formed on the silicon-on-insulator wafer or chip to provide a device precursor. FIG. 5A is a topview of the device precursor. FIG. 5B is a cross-section of the device precursor shown in FIG. 5A taken along the line labeled B. FIG. 5C is a cross-section of the device precursor shown in FIG. 5A taken along the line labeled C. The first mask 56 leaves exposed the regions of the device precursor where the electro-absorption cavities 54 are to be formed for both the component regions 53 and the dummy regions 52 and protects the remainder of the device precursor. As noted above, the electro-absorption cavities 54 are the region of the device precursor where the electro-absorption medium will be formed. Since the electro-absorption medium will be formed on the bottom of the electro-absorption cavities 54, the bottom of the electro-absorption cavity 54 for the component region 53 serves as the component area and the bottom of the electro-absorption cavity 54 for the dummy region 52 serves as the dummy area. A first etch is then performed so as to form the electro-absorption cavities 54 for both the component regions 53 and the dummy regions 52. The first etch is performed such that seed portions 34 of the light-transmitting medium 18 remains on the base 20 in the electro-absorption cavities 54 for both the component regions 53 and the dummy regions 52. Accordingly, the first etch is terminated before the base 20 is reached. Since the first etch etches the electro-absorption cavities 54 for both the component regions 53 and the dummy regions 52, these electro-absorption cavities 54 are formed concurrently. Additionally, since the first etch etches the same material to form the electro-absorption cavities 54 for both the component regions 53 and the dummy regions 52, the resulting electro-absorption cavities 54 are etched to about the same depth. The first etch yields the device precursor of FIG. 5A through FIG. 5C.

A suitable first mask 56 includes, but is not limited to, a hard mask such as a silica mask. A suitable first etch includes, but is not limited to, a dry etch.

Figures 6A, 6C:
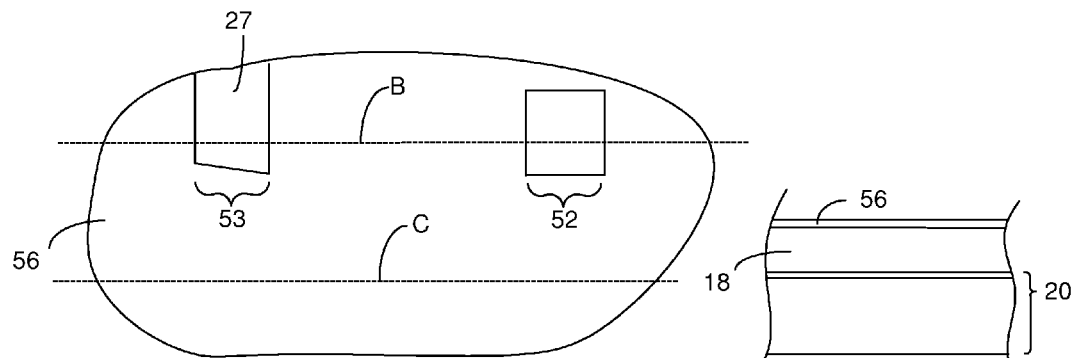
Figure 6B:
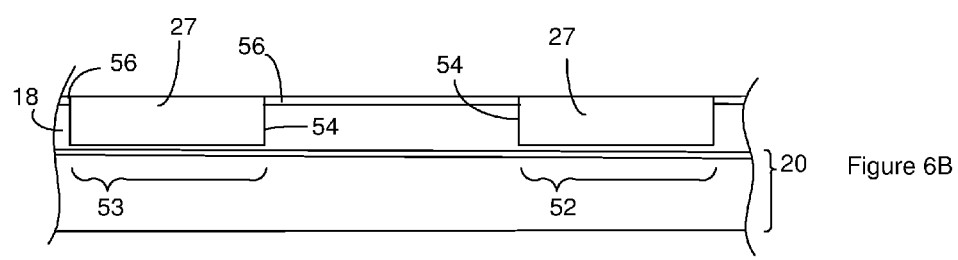

As shown in FIG. 6A through FIG. 6C, the electro-absorption medium 27 is formed in the sensor cavities 54 of FIG. 5A through FIG. 5C. FIG. 6A is a topview of the device precursor. FIG. 6B is a cross-section of the device precursor shown in FIG. 6A taken along the line labeled B. FIG. 6C is a cross-section of the device precursor shown in FIG. 6A taken along the line labeled C. When the light-transmitting medium 18 is silicon and the electro-absorption medium 27 is germanium-silicon, the electro-absorption medium 27 can be grown on the seed portion 34 of the silicon using techniques such as epitaxial growth. The electro-absorption medium 27 can be concurrently gown in the component regions 53 and the dummy regions 52 on the device precursor. The characteristics of the dummy regions 52 that are in the local zone associated with each component region 53 determines the composition of the electro-absorption medium 27 can that forms in each of the component regions 53. As a result, even though the electro-absorption medium 27 is concurrently grown in different component regions 53, the composition of the electro-absorption medium 27 is different in different component regions 53.

After formation of the electro-absorption medium 27, the first mask 56 can be removed and the device precursor can be planarized. Suitable methods for polishing include, but are not limited to, a chemical-mechanical polishing (CMP) process.

Figure 7A:
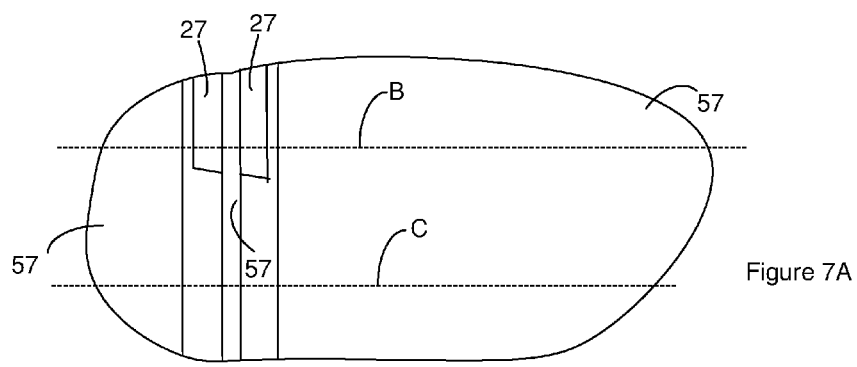
Figure 7C:
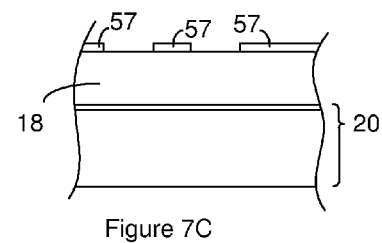
Figure 7B:
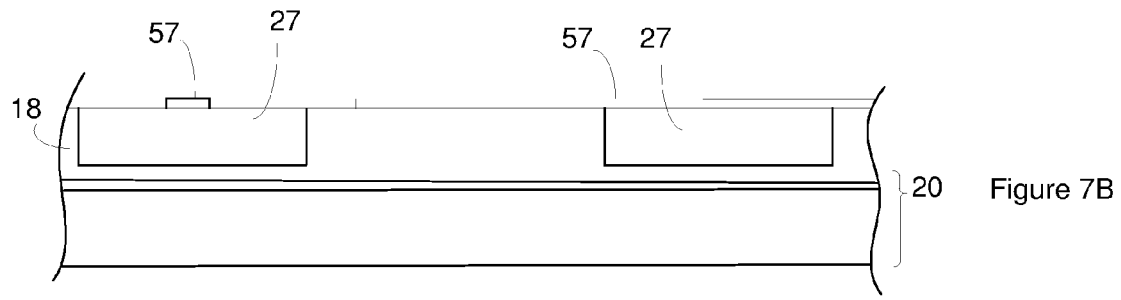

A second mask 57 can be formed on the device precursor so as to provide the device precursor of FIG. 7A through FIG. 7C. FIG. 7A is a topview of the device precursor. FIG. 7B is a cross-section of the device precursor shown in FIG. 7A taken along the line labeled B. FIG. 7C is a cross-section of the device precursor shown in FIG. 7A taken along the line labeled C. The second mask 57 is formed such that the regions where the ridge of the waveguide is to be formed is protected. Additionally, the second mask 57 protects the dummy regions 52 as is evident in FIG. 7B. The second mask 57 leaves exposed the regions where the trenches 24 are to be formed. Since the second mask 57 continues to protect the dummy regions 52 until the second mask 57 is removed, the remainder of the method discussion focuses on the fabrication of the modulator rather than on the dummy regions 52.

Figure 8A:
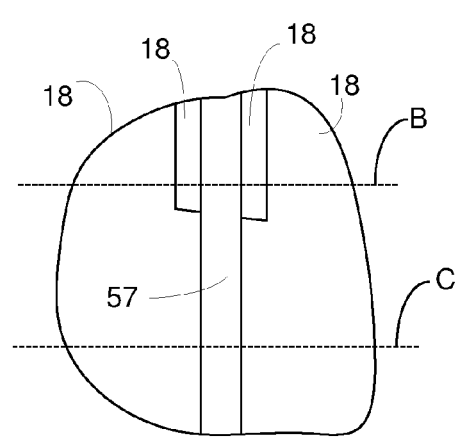
Figure 8B:
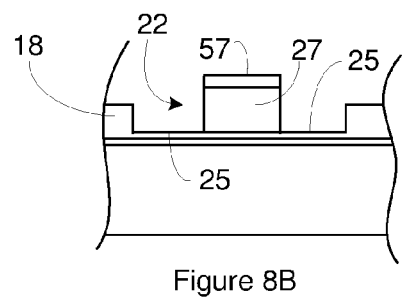
Figure 8C:
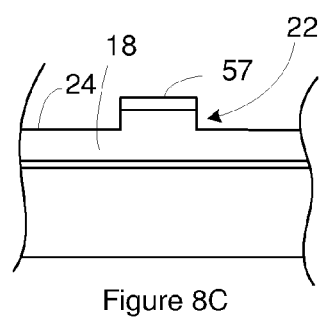

A second etch is performed on the device precursor of FIG. 7A through FIG. 7C to provide the device precursor of FIG. 8A through FIG. 8C. FIG. 8A is a topview of the device precursor. FIG. 8B is a cross-section of the device precursor shown in FIG. 8A taken along the line labeled B. FIG. 8C is a cross-section of the device precursor shown in FIG. 8A taken along the line labeled C. The second etch can be performed so as to form the trenches 24 to the desired depth. Since the second etch etches the light-transmitting medium 18 and the electro-absorption medium 27 concurrently, the second etch etches the light-transmitting medium 18 and the electro-absorption medium 27 to different depths. For instance, FIG. 8B illustrates the electro-absorption medium 27 etched deeper than the light-transmitting medium 18. The ratio of the speed at which the second etch etches the electro-absorption medium 27 relative to the light-transmitting medium 18 can be altered by changing etch chemistry.

In some instances, the this ratio is selected so the second etch is performed through the electro-absorption medium 27 positioned on either side of the ridge 22 down to the underlying light-transmitting medium 18 or down to the base 20. When the second etch is performed through the electro-absorption medium 27, the electro-absorption medium 27 is removed from a portion of the component region 53. As a result, in some instances, the electro-absorption medium 27 does not cover the entire component region 53.

A suitable second etch includes, but is not limited to, a dry etch that can etch both the light-transmitting medium 18 and the electro-absorption medium 27.

A third mask 58 is formed on the device precursor of FIG. 8A through FIG. 8C as shown by the device precursor of FIG. 9A through FIG. 9C. FIG. 9A is a topview of the device precursor. FIG. 9B is a cross-section of the device precursor shown in FIG. 9A taken along the line labeled B. FIG. 9C is a cross-section of the device precursor shown in FIG. 9A taken along the line labeled C. Portions of the third mask 58 are formed over the second mask 57. The third mask 58 is formed such that the locations on the device precursor where taper portions of the recesses are to be formed remain exposed while the remaining regions of the illustrated portion of the device precursor are protected. The taper portions of the recesses are the portions of the recesses that are spaced apart from the ridge 22.

A third etch is then performed so as to provide the device precursor of FIG. 10A through FIG. 10C. FIG. 10A is a topview of the device precursor. FIG. 10B is a cross-section of the device precursor shown in FIG. 10A taken along the line labeled B. FIG. 10C is a cross-section of the device precursor shown in FIG. 10A taken along the line labeled C. The third etch is performed to about the depth to which the electro-absorption medium 27 was etched during the second etch. As a result, the third etch forms the taper portions of the recesses 25.

A suitable third mask 58 includes, but is not limited to, a photoresist. A suitable third etch includes, but is not limited to, a dry etch.

The third mask 58 is removed and doped regions 40, 42 are formed in the light-transmitting medium 18 and in the electro-absorption medium 27 so as to provide the device precursor of FIG. 11A and FIG. 11B. FIG. 11A is a topview of the device precursor. FIG. 11B is a cross-section of the device precursor shown in FIG. 11A taken along the line labeled B. The n-type doped regions can be generated by forming a doping mask on the device precursor so the locations of the n-type doped regions are exposed and the remainder of the illustrated portion of the device precursor is protected. High angle dopant implant processes can be employed to form the n-type doped regions. The doping mask can then be removed. The same sequence can then be employed to form the p-type doped regions. The p-type doped regions can be formed before the n-type doped regions or the n-type doped regions can be formed before the p-type doped regions.

The second mask 57 is removed from the device precursor of FIG. 11A and FIG. 12B and a first cladding 59 is formed on the device precursor so as to provide the device precursor of FIG. 12. FIG. 12 is a cross section of the device precursor through the region where the modulator is being formed such as the cross section of FIG. 11B. The first cladding 59 is formed such that the portion of the doped regions 42 that are to be contacted by the electrical conductors 44 remain exposed and the remainder of the illustrated portion of the device precursor are protected by the first cladding 59. A suitable first cladding 59 includes, but is not limited to, PECVD deposited silica that is subsequently patterned using photolithography.

The electrical conductors 44 are formed on the device precursor of FIG. 12 so as to provide the device precursor of FIG. 13. FIG. 12 is a cross section of the device precursor through the region where the modulator is being formed such as the cross section of FIG. 11B. The electrical conductors 44 can be formed so each electrical conductor 44 extend from one of the doped regions 42, out of the recess 25, and over the light-transmitting medium 18. Suitable electrical conductors 44 include metals such as titanium and aluminum. The metals can be deposited by sputtering and patterned by photolithography.

A second cladding 60 can optionally be formed on the device precursor of FIG. 13 so as to provide the device precursor of FIG. 14. FIG. 12 is a cross section of the device precursor through the region where the modulator is being formed such as the cross section of FIG. 11B. As is evident in FIG. 14, the second cladding 60 can be patterned such that the second cladding 60 defines contact pads the electrical conductors 44. A suitable second cladding 60 includes, but is not limited to, PECVD deposited SiN that is subsequently patterned using photolithography. After removing photoresists formed during photolithography, the device precursor of FIG. 14 can be sintered to form the optical device.

Although the above method discloses protection of the dummy regions 52 after their formation, other methods can be employed. For instance, methods that remove all or a portion of the electro-absorption medium 27 from the dummy regions 52 can be employed. However, as discussed above, the presence of the electro-absorption medium 27 in the dummy regions 52 can reduce the stress on the device. As a result, removal of the electro-absorption media 27 from the dummy regions 52 can add undesirable stress to the device.

The device can be used in conjunction with electronics that are in electrical communication with the contact pads. The electronics can apply electrical energy to the contact pads. Suitable electronics for operating the above modulators can include a controller. A suitable controller includes, but is not limited to, a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions attributed to the electronics. A general-purpose processor may be a microprocessor, but in the alternative, the controller may include or consist of any conventional processor, microcontroller, or state machine. A controller may also be implemented as a combination of computing devices, e.g., a combination of a DSP and a microprocessor, a plurality of microprocessors, one or more microprocessors in conjunction with a DSP core, or any other such configuration.

The electronics can optionally include a memory in communication with the controller. The electronics can store data for executing the functions of the electronics in the memory. The memory can be any memory device or combination of memory devices suitable for read and/or write operations.

In some instances, the electronics include a computer-readable medium in communication with the controller. The computer-readable medium can have a set of instructions to be executed by the controller. The controller can read and execute instructions included on the computer-readable medium. The controller executes the instructions such that the electronics perform one or more of the described functions. The computer-readable medium cab be different from the memory or can be the same as the memory. Suitable computer-readable media include, but are not limited to, optical discs such as CDs, magnetic storage diskettes, Zip disks, magnetic tapes, RAMs, and ROMs. Some functions of the electronics may be executed using hardware as opposed to executing these functions in firmware and/or software.

The method of FIG. 4A through FIG. 14 can be adapted to form the other embodiment disclosed above. For instance, the structure of FIG. 1G can be generated by performing the second etch through the electro-absorption medium 27 positioned on either side of the ridge 22, and through the underlying light-transmitting medium 18 down to the base 20. Alternately, the structure of FIG. 1H and FIG. 2A can be generated by stopping the second etch before etching through the electro-absorption medium 27 positioned on either side of the ridge 22, and leaving a layer of the electro-absorption medium 27 on the underlying light-transmitting medium 18.

Example 1

Figure 15:
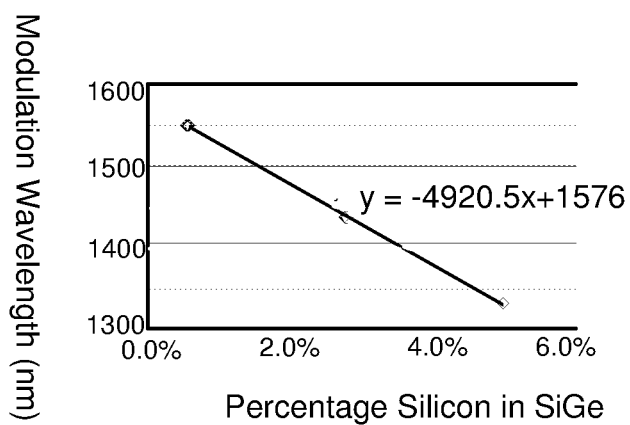
FIG. 15 is a graph showing modulation wavelength versus composition of a Franz-Keldysh effect material used in a modulator.

A series of devices having a modulator according to FIG. 2A were constructed using $Ge_{1-x}Si_x$ (germanium-silicon) as the electro-absorption medium. The modulation wavelengths versus the percentage of silicon in the $Ge_{1-x}Si_x$ was studied. The results are presented in FIG. 15. FIG. 15 is a plot of the modulation wavelength versus the percentage of silicon in the $Ge_{1-x}Si_x$. FIG. 15 shows that a change in the percentage of silicon in the $Ge_{1-x}Si_x$ of around 4% can shift the modulation wavelength by around 200 nm.

Example 2

Figure 16:
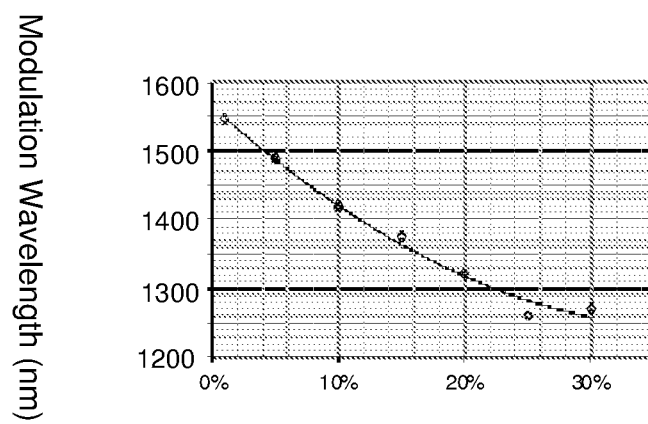
FIG. 16 is a plot of the modulation wavelength versus the percentage of a localized device area upon which a Franz-Keldysh effect material is grown.

A series of wafers having modulator devices according to FIG. 2A were constructed using $Ge_{1-x}Si_x$ (germanium-silicon) as the electro-absorption medium. Different devices had different formation areas. For instance, the percentages of the localized zones around the components that included electro-absorption medium were varied on the different wafers. The effects of the different formation areas on the modulation wavelengths were studied and the results presented in FIG. 16. FIG. 16 is a plot of the modulation wavelength versus percentage of device area that is formation area within around 2 mm of the modulator. FIG. 16 shows that increasing the percentage of device area that is formation area around 30% can change the modulation wavelength on the order of 300 nm.

These experiment results show that the electro-absorption media concurrently formed in different component regions can have vastly different compositions. For instance, the molar percentage of one element in the composition can vary by more than 10%, 5%, 1% or 0.1% between different and concurrently formed component regions on the same device. As an example, the variable x in $Ge_{1-x}Si_x$ can vary by more than 0.10, 0.05, 0.01 or 0.001 between different and concurrently formed component regions on the same device. When the optical component is a modulator, these results illustrate that different modulators can have vastly different modulation wavelengths even when the electro-absorption media included in those modulators was concurrently formed. For instance, the difference in the modulation wavelength for modulators having concurrently formed electro-absorption media can be greater than 50 nm, 100 nm, 200 nm, or even 300 nm.

Although the devices and methods disclosed above are disclosed in the context of a modulator, the control of the composition of the electro-absorption medium can be employed in conjunction with other components. Examples of other component that can benefit from composition control include, but are not limited to, detectors and light sources such as lasers. Although the devices and methods disclosed above are disclosed with the electro-absorption medium being left in the dummy regions 52 of the final product, all or a portion of the electro-absorption medium can optionally be removed from all or a portion of the dummy regions 52 through methods such as etching.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:

1. An optical device, comprising:
    an optical component on a base, the optical component including an electro-absorption medium through which light signals are guided during operation of the component; and
    dummy regions on the base, the dummy regions including the electro-absorption medium but without the electro-absorption medium included in the dummy regions being included in the component or in another optical component on the base
    the dummy regions being within 2 mm of the optical component.

2. The device of claim 1, wherein the component is a modulator.

3. The device of claim 1, wherein the dummy regions are within 1 mm of the optical component and an area of the device occupied by the electro-absorption medium included in the dummy regions is greater than 5% of the area of the device that is within 1 mm of the optical component.

4. The device of claim 1, wherein an area of the device occupied by the electro-absorption medium included in the dummy regions is greater than 5% of the area of the device that is within 2 mm of the optical component.

5. The device of claim 1, further comprising common dummy regions that each includes the electro-absorption medium but without the electro-absorption medium included in the common dummy regions being included in the component or in another optical component on the base, the common dummy regions each being more than 2 mm from the optical component.

6. The device of claim 5, wherein an area of the device occupied by the electro-absorption medium included in the common dummy regions, the dummy regions and in the optical component is greater than 5% of the area of the device.

7. The device of claim 1, wherein the optical component includes an electrical conductor that carries electrical energy during the operation of the component, the electrical conductor being positioned such that one or more of the dummy regions is located between the electrical conductor and the base.

8. A method of forming an optical device, comprising:
    growing an electro-absorption medium in a variety of different regions on a base of a device precursor, the regions including a component region and being selected so as to achieve a particular chemical composition for the electro-absorption medium included in the component region;

forming an optical component on the device precursor such that the optical component includes at least a portion of the electro-absorption medium from the component region, the component being formed such that during operation of the optical component light signals are guided through the electro-absorption medium from the component region; and completing formation of the device such that a portion of the regions still include the electro-absorption medium and are dummy regions, where the electro-absorption medium included in dummy regions not being included in the optical component or in another optical component on the device, the dummy regions being within 2 mm of the optical component.

9. The method of claim 8, wherein the component is a modulator configured such that the composition of the electro-absorption medium from the component region affects a modulation wavelength of the modulator.

10. The method of claim 8, wherein the dummy regions are within 1 mm of the optical component.

11. The method of claim 10, wherein an area of the device occupied by the electro-absorption medium included in the dummy regions is greater than 5%.

12. The method of claim 10, further comprising common dummy regions that each includes the electro-absorption medium but without the electro-absorption medium included in the common dummy regions being included in the component or in another optical component on the base, the common dummy regions each being more than 2 mm from the optical component.

13. The method of claim 12, wherein an area of the device occupied by the electro-absorption medium included in the common dummy regions, the dummy regions and in the optical component is greater than 5%.

14. The method of claim 8, wherein the electro-absorption medium is concurrently grown in each of the different regions.

15. A method of forming an optical device, comprising:

forming an electro-absorption medium in a variety of different regions on a base of a device precursor; and completing formation of the device such that the electro-absorption medium included in a portion of the regions is included in an optical component and another portion of the regions are dummy regions in that the electro-absorption medium included in the dummy regions is not included in the optical component or in another optical component on the device, the optical component including the electro-absorption medium arranged such that during operation of the component light signals are guided through the electro-absorption medium included in the optical component, and the dummy regions being within 2 mm of the optical component.

16. The method of claim 15, wherein the dummy regions are within 1 mm of the optical component.

17. The method of claim 15, wherein an area of the device occupied by the electro-absorption medium included in the dummy regions is greater than 5%.

18. The method of claim 15, wherein the regions also include common dummy regions that each includes the electro-absorption medium but without the electro-absorption medium included in the common dummy regions being included in the component or in another optical component on the base, the common dummy regions each being more than 2 mm from the optical component.

19. The method of claim 18, wherein an area of the device occupied by the electro-absorption medium included in the common dummy regions, the dummy regions and in the optical component is greater than 5%.

20. The method of claim 19, wherein the electro-absorption medium is concurrently grown in each of the different regions.

* * * * *